(12) United States Patent
Chibvongodze et al.

(10) Patent No.: US 7,974,124 B2
(45) Date of Patent: Jul. 5, 2011

(54) POINTER BASED COLUMN SELECTION TECHNIQUES IN NON-VOLATILE MEMORIES

(75) Inventors: Hardwell Chibvongodze, Hiratsuka (JP); Manabu Sakai, Yokohama (JP); Teruhiko Kamei, Yokohama (JP)

(73) Assignee: SanDisk Corporation, Milpitas, CA (US)

( * ) Notice: Subject to any disclaimer, the term of this patent is extended or adjusted under 35 U.S.C. 154(b) by 266 days.

(21) Appl. No.: 12/490,655

(22) Filed: Jun. 24, 2009

(65) Prior Publication Data

US 2010/0329007 A1 Dec. 30, 2010

(51) Int. Cl.
*G11C 11/34* (2006.01)
*G11C 16/04* (2006.01)
(52) U.S. Cl. .............. 365/185.05; 365/189.12
(58) Field of Classification Search ............. 365/185.05, 365/233.1, 189.12, 239
See application file for complete search history.

(56) References Cited

U.S. PATENT DOCUMENTS

| | | | |
|---|---|---|---|
| 3,710,348 A | 1/1973 | Craft | |
| 3,895,360 A | 7/1975 | Cricchi et al. | |
| 4,034,356 A | 7/1977 | Howley et al. | |
| 4,266,271 A | 5/1981 | Chamoff et al. | |
| 4,314,334 A | 2/1982 | Daughton et al. | |
| 4,357,685 A | 11/1982 | Daniele et al. | |
| 4,402,067 A | 8/1983 | Moss et al. | |
| 4,720,815 A | 1/1988 | Ogawa | |
| 4,757,477 A | 7/1988 | Nagayama et al. | |
| 4,800,530 A | 1/1989 | Itoh et al. | |
| 4,802,136 A | 1/1989 | Nose et al. | |
| 4,835,549 A | 5/1989 | Samejima et al. | |
| 4,852,062 A | 7/1989 | Baker et al. | |
| 5,070,032 A | 12/1991 | Yuan et al. | |
| 5,095,344 A | 3/1992 | Harari | |
| 5,168,463 A | 12/1992 | Ikeda et al. | |
| 5,172,338 A | 12/1992 | Mehrotra et al. | |
| 5,200,959 A | 4/1993 | Gross et al. | |

(Continued)

FOREIGN PATENT DOCUMENTS

CN 1568522 A 1/2005

(Continued)

OTHER PUBLICATIONS

Eitan et al., "NROM: A Novel Localized Trapping, 2-Bit Nonvolatile Memory Cell," *IEEE Electron Device Letters*, vol. 21, No. 11, Nov. 2000, pp. 543-545.

(Continued)

*Primary Examiner* — Anh Phung
(74) *Attorney, Agent, or Firm* — Davis Wright Tremaine LLP

(57) ABSTRACT

Selecting circuits for columns of an array of memory cells are used to hold read data or write data of the memory cells. In a first set of embodiments, a shift register chain, having a stage for columns of the array, has the columns arranged in a loop. For example, every other column or column group could be assessed as the pointer moves in first direction across the array, with the other half of the columns being accessed as the pointer moves back in the other direction. Another set of embodiments divides the columns into two groups and uses a pair of interleaved pointers, one for each set of columns, clocked at half speed. To control the access of the two sets, each of which is connected to a corresponding intermediate data bus. The intermediate data buses are then attached to a combined data bus, clocked at full speed.

18 Claims, 14 Drawing Sheets

U.S. PATENT DOCUMENTS

| | | | |
|---|---|---|---|
| 5,270,979 | A | 12/1993 | Harari et al. |
| 5,297,029 | A | 3/1994 | Nakai et al. |
| 5,307,232 | A | 4/1994 | Manske |
| 5,307,323 | A | 4/1994 | Fukuda et al. |
| 5,313,421 | A | 5/1994 | Guterman et al. |
| 5,315,541 | A | 5/1994 | Harari et al. |
| 5,343,063 | A | 8/1994 | Yuan et al. |
| 5,351,210 | A | 9/1994 | Saito |
| 5,359,571 | A | 10/1994 | Yu |
| 5,369,618 | A | 11/1994 | Takasugi |
| 5,380,672 | A | 1/1995 | Yuan et al. |
| 5,381,455 | A | 1/1995 | Ovens et al. |
| 5,386,390 | A | 1/1995 | Okitaka |
| 5,410,513 | A * | 4/1995 | Masuda et al. ............ 365/236 |
| 5,418,752 | A | 5/1995 | Harari et al. |
| 5,422,842 | A | 6/1995 | Cernea et al. |
| 5,428,621 | A | 6/1995 | Mehrotra et al. |
| 5,430,679 | A | 7/1995 | Hiltebeitel et al. |
| 5,430,859 | A | 7/1995 | Norman et al. |
| 5,432,741 | A | 7/1995 | Devore et al. |
| 5,442,748 | A | 8/1995 | Chang et al. |
| 5,479,370 | A | 12/1995 | Furuyama et al. |
| 5,485,425 | A | 1/1996 | Iwai et al. |
| 5,535,170 | A * | 7/1996 | Imamura et al. ............ 365/239 |
| 5,570,315 | A | 10/1996 | Tanaka et al. |
| 5,595,924 | A | 1/1997 | Yuan et al. |
| 5,602,987 | A | 2/1997 | Harari et al. |
| 5,606,584 | A | 2/1997 | Beat |
| 5,642,312 | A | 6/1997 | Harari |
| 5,657,332 | A | 8/1997 | Auclair et al. |
| 5,661,053 | A | 8/1997 | Yuan |
| 5,663,901 | A | 9/1997 | Wallace et al. |
| 5,712,180 | A | 1/1998 | Guterman et al. |
| 5,726,947 | A | 3/1998 | Yamazaki et al. |
| 5,768,192 | A | 6/1998 | Eitan |
| 5,774,397 | A | 6/1998 | Endoh et al. |
| 5,783,958 | A | 7/1998 | Lysinger |
| 5,801,981 | A | 9/1998 | Iwakiri |
| 5,815,444 | A | 9/1998 | Ohta |
| 5,835,406 | A | 11/1998 | Chevallier et al. |
| 5,848,009 | A | 12/1998 | Lee et al. |
| 5,862,080 | A | 1/1999 | Harari et al. |
| 5,890,192 | A | 3/1999 | Lee et al. |
| 5,903,495 | A | 5/1999 | Takeuchi et al. |
| 5,940,329 | A | 8/1999 | Seitsinger et al. |
| 5,946,253 | A | 8/1999 | Fujiwara |
| 6,011,725 | A | 1/2000 | Eitan |
| 6,028,472 | A | 2/2000 | Nagumo |
| 6,034,891 | A | 3/2000 | Norman |
| 6,034,910 | A | 3/2000 | Iwase |
| 6,038,184 | A | 3/2000 | Naritake |
| 6,046,935 | A | 4/2000 | Takeuchi et al. |
| 6,091,666 | A | 7/2000 | Arase et al. |
| 6,151,248 | A | 11/2000 | Harari et al. |
| 6,172,917 | B1 | 1/2001 | Kataoka et al. |
| 6,222,757 | B1 | 4/2001 | Rau et al. |
| 6,222,762 | B1 | 4/2001 | Guterman et al. |
| 6,230,233 | B1 | 5/2001 | Lofgren et al. |
| 6,252,800 | B1 | 6/2001 | Chida |
| 6,256,230 | B1 | 7/2001 | Miwa et al. |
| 6,256,252 | B1 | 7/2001 | Arimoto |
| 6,327,206 | B2 | 12/2001 | Kubota et al. |
| 6,373,746 | B1 | 4/2002 | Takeuchi et al. |
| 6,385,075 | B1 | 5/2002 | Taussig et al. |
| 6,396,736 | B1 | 5/2002 | Jyouno et al. |
| 6,426,893 | B1 | 7/2002 | Conley et al. |
| 6,469,945 | B2 | 10/2002 | Patti et al. |
| 6,480,423 | B2 | 11/2002 | Toda et al. |
| 6,496,431 | B1 | 12/2002 | Nakahara et al. |
| 6,496,971 | B1 | 12/2002 | Lesea et al. |
| 6,512,263 | B1 | 1/2003 | Yuan et al. |
| 6,522,580 | B2 | 2/2003 | Chen et al. |
| 6,560,146 | B2 | 5/2003 | Cernea |
| 6,594,177 | B2 | 7/2003 | Matarrese et al. |
| 6,603,683 | B2 | 8/2003 | Hsu et al. |
| 6,609,209 | B1 | 8/2003 | Tiwari et al. |
| 6,609,236 | B2 | 8/2003 | Watanabe et al. |
| 6,717,858 | B2 | 4/2004 | Kawai et al. |
| 6,771,536 | B2 | 8/2004 | Li et al. |
| 6,781,877 | B2 | 8/2004 | Cernea et al. |
| 6,795,837 | B1 | 9/2004 | Wells |
| 6,813,184 | B2 | 11/2004 | Lee |
| 6,822,911 | B2 | 11/2004 | Cernea |
| 6,842,160 | B2 | 1/2005 | Yamazaki et al. |
| 6,853,596 | B2 | 2/2005 | Cheung |
| 6,862,217 | B2 | 3/2005 | Kawabata |
| 6,891,753 | B2 | 5/2005 | Cernea |
| 6,975,536 | B2 | 12/2005 | Maayan et al. |
| 6,983,428 | B2 | 1/2006 | Cernea |
| 6,985,388 | B2 | 1/2006 | Cernea |
| 6,990,018 | B2 | 1/2006 | Tanaka et al. |
| 7,023,736 | B2 | 4/2006 | Cernea et al. |
| 7,027,330 | B2 | 4/2006 | Park |
| 7,057,339 | B2 | 6/2006 | Boroson et al. |
| 7,085,159 | B2 | 8/2006 | Cernea |
| 7,110,294 | B2 | 9/2006 | Kawai |
| 7,170,802 | B2 | 1/2007 | Cernea et al. |
| 7,405,985 | B2 | 7/2008 | Cernea et al. |
| 2001/0024397 | A1 | 9/2001 | Kubota et al. |
| 2001/0052062 | A1 | 12/2001 | Lipovski |
| 2003/0016182 | A1 | 1/2003 | Lohr |
| 2003/0161182 | A1 | 8/2003 | Li et al. |
| 2003/0223274 | A1 | 12/2003 | Cernea |
| 2004/0057283 | A1 | 3/2004 | Cernea |
| 2004/0057288 | A1 | 3/2004 | Kawabata |
| 2004/0060031 | A1 | 3/2004 | Cernea |
| 2004/0109357 | A1 | 6/2004 | Cernea et al. |
| 2004/0125651 | A1 | 7/2004 | Toda |

FOREIGN PATENT DOCUMENTS

| | | |
|---|---|---|
| EP | 00851424 | 7/1998 |
| EP | 1 681 680 A2 | 7/2006 |
| JP | 61292747 A | 12/1986 |
| JP | 62-287497 A | 12/1987 |
| JP | 01128297 | 5/1989 |
| JP | 3156966 | 7/1991 |
| JP | 06150666 A | 5/1994 |
| JP | H11-162183 | 6/1999 |
| JP | 10172292 | 6/2008 |
| WO | WO 92/22068 | 12/1992 |
| WO | WO03/025939 | 3/2003 |

OTHER PUBLICATIONS

U.S. Appl. No. 12/478,997 entitled "Folding Data Stored in Binary Format into Multi-State Format Within Non-Volatile Devices," filed Jun. 5, 2009, 52 pages.

U. Tietze—CH. Schenk, "Halbleiterschaltungstechnik," 1974, Springer-Verlag, Berlin; XP002267743; paragraph 18.6.2 (Translation).

Notification of Transmittal of the International Searching Search Report and the Written Opinion of the International Searching Authority, or the Declaration for International Application No. US2010/038616 dated Oct. 15, 2010, 13 pages.

* cited by examiner

POINTER BASED COLUMN SELECTION TECHNIQUES IN NON-VOLATILE MEMORIES

BACKGROUND OF THE INVENTION

The present invention relates to nonvolatile erasable programmable memories and more specifically, techniques for reading and writing data for these types of memories.

Memory and storage is one of the key technology areas that is enabling the growth in the information age. With the rapid growth in the Internet, World Wide Web (WWW), wireless phones, personal digital assistant, digital cameras, digital camcorders, digital music players, computers, networks, and more, there is continually a need for better memory and storage technology. A particular type of memory is nonvolatile memory. A nonvolatile memory retains its memory or stored state even when power is removed. Some types of nonvolatile erasable programmable memories include Flash, EEPROM, EPROM, MRAM, FRAM, ferroelectric, and magnetic memories. Some nonvolatile storage products include CompactFlash (CF) cards, MultiMedia cards (MMC), Flash PC cards (e.g., ATA Flash cards), SmartMedia cards, and memory sticks.

A widely used type of semiconductor memory storage cell is the floating gate memory cell. Some types of floating gate memory cells include Flash, EEPROM, and EPROM. The memory cells are configured or programmed to a desired configured state. In particular, electric charge is placed on or removed from the floating gate of a Flash memory cell to put the memory into two or more stored states. One state is an erased state and there may be one or more programmed states. Alternatively, depending on the technology and terminology, there may be a programmed state and one or more erased states. A Flash memory cell can be used to represent at least two binary states, a 0 or a 1. A Flash memory cell can store more than two binary states, such as a 00, 01, 10, or 11; this cell can store multiple states and may be referred to as a multistate memory cell. The cell may have more than one programmed states. If one state is the erased state (00), the programmed states will be 01, 10, and 11, although the actual encoding of the states may vary.

A number of architectures are used for non-volatile memories. A NOR array of one design has its memory cells connected between adjacent bit (column) lines and control gates connected to word (row) lines. The individual cells contain either one floating gate transistor, with or without a select transistor formed in series with it, or two floating gate transistors separated by a single select transistor. Examples of such arrays and their use in storage systems are given in the following U.S. patents of SanDisk Corporation that are incorporated herein in their entirety by this reference: U.S. Pat. Nos. 5,095,344, 5,172,338, 5,602,987, 5,663,901, 5,430,859, 5,657,332, 5,712,180, 5,890,192, 6,151,248, 6,426,893, and 6,512,263.

A NAND array of one design has a number of memory cells, such as 8, 16 or even 32, connected in series string between a bit line and a reference potential through select transistors at either end. Word lines are connected with control gates of cells in different series strings. Relevant examples of such arrays and their operation are given in U.S. Pat. No. 6,522,580, that is also hereby incorporated by reference.

Despite the success of nonvolatile memories, there also continues to be a need to improve the technology. It is desirable to improve the density, speed, durability, and reliability of these memories. It is also desirable to reduce power consumption.

As can be seen, there is a need for improving the operation of nonvolatile memories. Specifically, by using a technique of dynamic column block selection of the memory cells, this will reduce noise in the operation of the integrated circuit, which will permit the integrated circuit to operate more reliably. Further, the technique will also reduce the area required by the block selection circuitry, which will reduce the cost of manufacture.

SUMMARY OF THE INVENTION

In one set of aspects, a non-volatile memory circuit having an array re-programmable non-volatile memory cells formed along columns along bit-lines is presented. The memory also includes a plurality of column access circuits, each having a corresponding set of one or more temporary data storage devices and each connectable to one or more bit-lines to transfer data between addressed memory cells formed thereupon and the corresponding set of temporary data storage devices, and a plurality of N intermediate data buses. The column access circuits are arranged into N subsets each subset connected to a corresponding one of the intermediate data buses. A plurality of N shift registers is also included, where each shift register has a plurality of series connected stages coupled with a corresponding one of the subsets of the column access circuits in order to enable connection of the temporary data storage devices of the corresponding subset with the corresponding intermediate data bus in successive instances of time as a change of state is propagated from stage-to-stage. The memory further has a first clock source and a plurality of N second clock sources having a frequency of 1/N of the first clock source, each of the N second clock sources connected with a corresponding one of the shift registers to cause the change of state to be propagated along the stages thereof in sequence: a unified data bus; and a bus combining circuit connected to the intermediate data buses and the unified data bus to transfer data between the intermediate data buses and the unified data bus, where the unified data bus is clocked by the first clock source and carries the combined data content of the intermediate data buses.

In other aspects, a non-volatile memory circuit having an array re-programmable non-volatile memory cells formed along columns along bit-lines is presented. The memory also includes a plurality of column access circuits, each having a corresponding set of one or more temporary data storage devices and each connectable to one or more bit lines to transfer data between addressed memory cells formed thereupon and the corresponding set of temporary data storage devices, and a data bus. A shift register, including a plurality of series connected stages coupled with corresponding column access circuits, enables connection of the temporary data storage devices therein with the data bus in successive instances of time as a change of state is propagated from stage-to-stage. The column access circuits are divided into distinct first and second sets and wherein, in an access operation, the change of state propagates in a sequence moving in a first direction along the first set and subsequently in a sequence moving in a direction opposite the first direction in the second set. A clock source is connected to the shift register to cause the change of state to be propagated along the stages thereof in the sequence.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

Integrated circuits providing nonvolatile storage include nonvolatile erasable-programmable memory cells. Many types of integrated circuits having nonvolatile memory cells include memories, microcontrollers, microprocessors, and programmable logic. Nonvolatile memory integrated circuits may be combined with other nonvolatile memory integrated circuits to form larger memories. The nonvolatile memory integrated circuits may also be combined with other integrated circuits or components such as controllers, microprocessors, random access memories (RAM), or I/O devices, to form a nonvolatile memory system. An example of a Flash EEPROM system is discussed in U.S. Pat. No. 5,602,987, which is incorporated by reference along with all references cited in this application.

Further discussion of nonvolatile cells and storage is in U.S. Pat. Nos. 5,095,344, 5,270,979, 5,380,672, 5,712,180, 6,222,762, and 6,230,233, which are incorporated by reference.

Some types of nonvolatile storage or memory cells include Flash, EEPROM, and EPROM. There are many other types of nonvolatile memory technologies and the present invention may be applied to these technologies as well as other technologies. Some examples of other nonvolatile technologies include MRAM and FRAM cells. This patent application discusses some specific embodiments of the invention as applied to Flash or EEPROM technology. However, this discussion is to provide merely a specific example of an application of the invention and is not intended to limit the invention to Flash or EEPROM technology.

Figure 1:
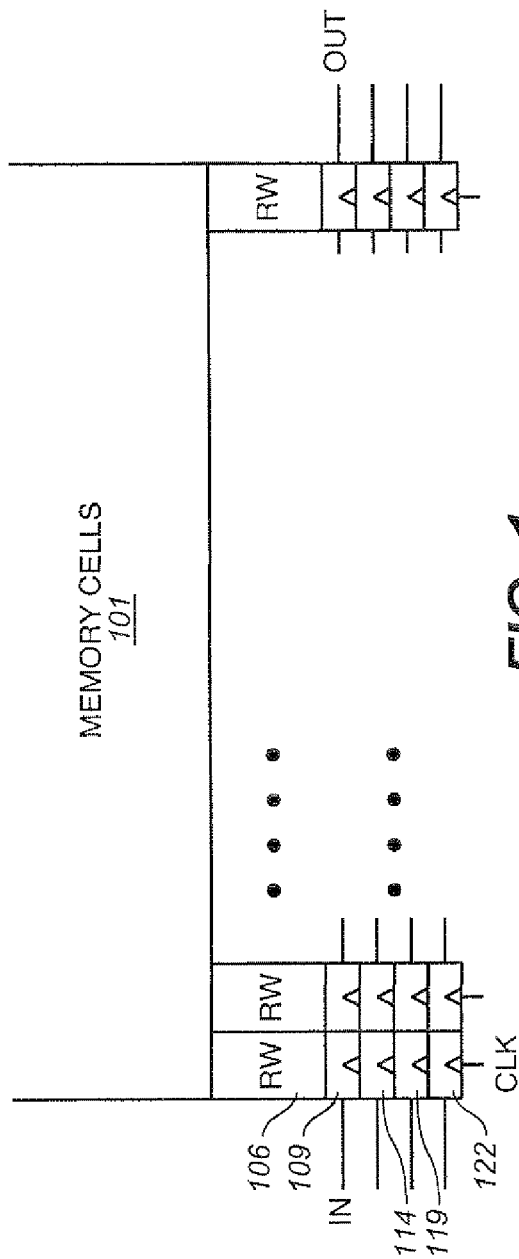
FIG. 1 shows an integrated circuit with shift registers for holding data to be read and written into the memory.

FIG. 1 shows a memory integrated circuit with memory cells 101. The integrated circuit may be a memory such as a Flash chip or may be an integrated circuit with an embedded memory portion, such as an ASIC or microprocessor with memory. The memory cells store binary information. In a specific embodiment, the memory cells are nonvolatile memory cells. Examples of some nonvolatile memory cells are floating gate cells, which include Flash, EEPROM, or EPROM cells. The memory cells are arranged in an array of rows and columns. There may be any number of rows and columns. Read/write circuits 106 are coupled to columns of the memory cells. In an embodiment, there is one read/write circuit for each column of memory cells. In other embodiments, one read/write circuit may be shared among two or more columns of memory cells. Sense amplifiers are used to read the states of the memory cells. The sense amplifiers may also be combined with other circuits in order to write or store data into the memory cells. The combination is referred to as a read/write circuit.

In a specific embodiment, the memory cells are multistate cells, capable of storing multiple bits of data per cell. In FIG. 1, the memory cells store two bits of data. This dual-bit memory cell was selected in order to illustrate the principles of the invention. Multistate memory cells may store more than two bits of data, such as three, four, and more.

FIG. 1 shows four shift registers 109, 114, 119, and 122. Each shift register stage has an input of IN and an output or OUT. Data is clocked in and out of the registers using a clock input at a CLK input. The clock input is connected to all the registers.

Figure 2:
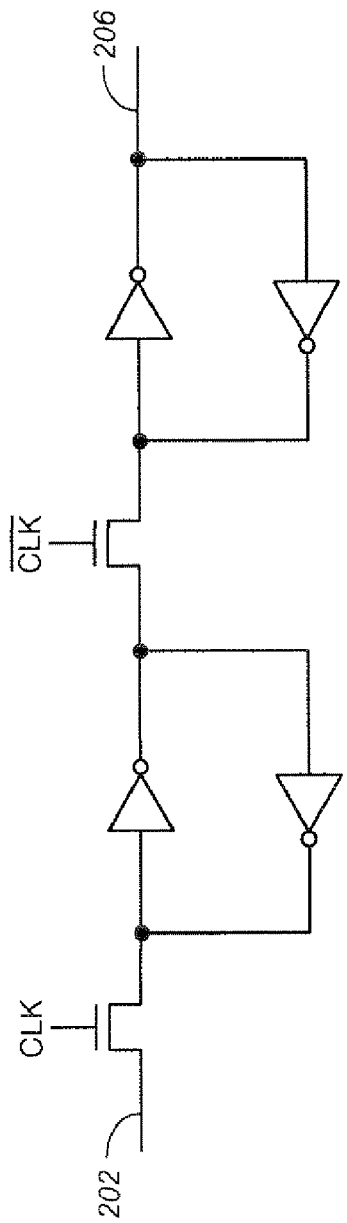
FIG. 2 shows an implementation of a master-slave register.

An example of a specific circuit implementation of a register of the shift register is shown in FIG. 2. This is known as a master-slave register. There are other circuit implementations for a register that may be used. An input 202 is the input to the shift register or is connected to a previous stage of the shift register. An output 206 is the output to the shift register or is connected to a next stage of the shift register.

Each of the four shift registers has one register which is associated with and connected to a particular read-write (RW) circuit. Each read-write circuit includes circuitry to read a state of memory cell and circuitry to write data into a memory cell. The circuitry was shown as a single block, but could also be drawn as two blocks, one for the write circuitry and one for the read circuitry. An example of read circuitry is a sense amplifier (SA) circuit. In other words, each read-write circuit has four registers associated with it. Two of these registers are used to hold the data to be written into the memory cell. Two registers are used to load the new data to be written while programming is proceeding, for improved performance. For example, registers 109 and 114 in FIG. 1 may be used to hold write data, and registers 119 and 122 may be used to load write data. The write data is serially streamed into the shift registers using IN and then written using read-write circuitry (i.e., write circuit) into the memory cells. Data from the memory cells is read out using the read-write circuit (i.e., read circuit or sense amplifier) and stored into the registers. The sense amplifiers can sense in parallel and dump data in parallel, in the shift registers.

For memory cells that hold more than two bits per cell, there would be an additional register for each additional bit. For example, for three bits per cell, there would be an additional two shift registers. Three registers for read data, and three registers for write data.

The embodiment of FIG. 1 shows a separate set of registers for loading/unloading and actual read and write data. In other embodiments, one set of registers may be shared to handle both load and write or read and unload; this will save integrated circuit area. However, by having individual sets of registers for load and write or read and unload, this improves performance because both types of operation can occur at the same time. Furthermore, in an alternative embodiment, there may be separate clocks, such as a read clock and a write clock, for the read and write registers. This will allow independent inputting of data into the respective read or write data shift register.

As bits are clocked into and out of the shift registers, depending on the particular pattern of the data, there may be a significant amount of switching noise. For example, if the pattern were a string of alternating 0s and 1s (i.e., 01010101 . . . 0101), this would generate a lot of switching noise because there will be full rail transitions occurring at each clock. And the noise is further dependent on the number of shift registers switching at the same time.

In summary for the approach in FIG. 1, the circuits store and transfer data by means of shift registers: In read mode, read circuitry or sense amplifiers dump data into shift registers, then data are streamed out. During programming, data are shifted in and stored into these shift registers. Shift registers are made of two latches, a "master" and a "slave." Shifting in or out data through the masters and the slaves creates a lot of noise, depending upon data pattern. For example, if data is mostly alternating 0s and 1s, then thousand of masters and slaves will toggle their outputs accordingly.

Figure 3:
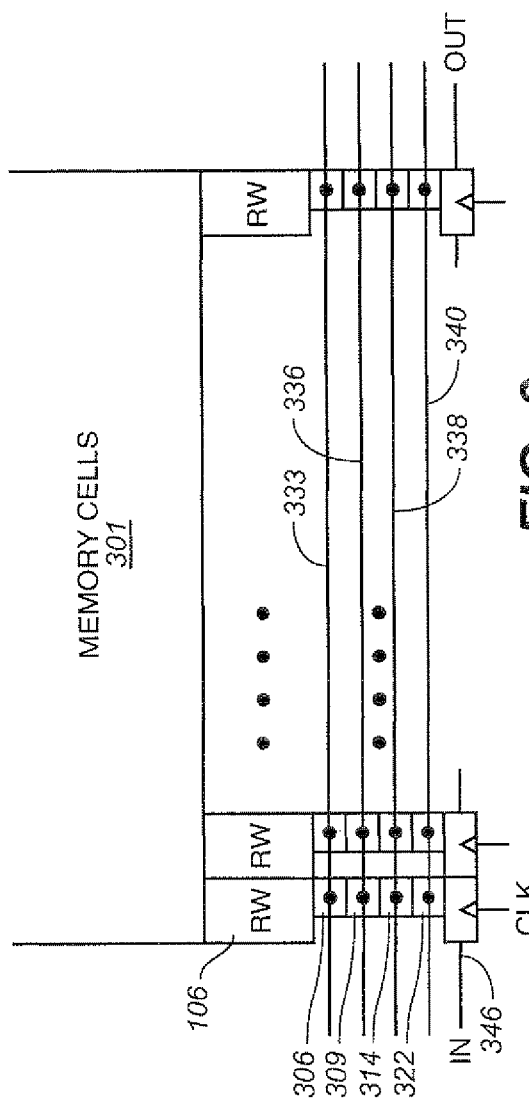
FIG. 3 shows an integrated circuit with latches for holding data to be read and written into the memory.

FIG. 3 shows another circuit architecture for reading and writing data to memory cells 301 of an integrated circuit. This architecture requires less integrated circuit area and generates less noise than that in FIG. 17 especially for high density, multistate memory cells. The integrated circuit may be a memory such as a Flash chip or may be an integrated circuit with a embedded memory portion, such as an ASIC or microprocessor with memory. The memory cells store binary information. In a specific embodiment, the memory cells are nonvolatile memory cells. Examples of some nonvolatile memory cells are floating gate, Flash, or EEPROM cells. The memory cells are arranged in an array of rows and columns. There can be any number of rows and columns.

Read-write (RW) circuits 106 in FIG. 1 are coupled to columns of the memory cells. In an embodiment, there is one read-write circuit for each column of memory cells. In other embodiments, one read-write circuit may be shared among two or more columns of memory cells. The read-write circuits are used to read the states of the memory cells. The read-write circuits may be also be used to write or store data into the memory cells. The read-write circuitry may include sense amplifier circuits, as discussed above.

In a specific embodiment, the memory cells are multistate cells, capable of storing multiple bits of data per cell. As with the embodiment of FIG. 1, for the purpose of serving as an exemplary embodiment, memory cells 301 of FIG. 3 are dual-bit multibit memory cells. This dual-bit memory cell was selected in order to illustrate the principles of the invention. Multistate memory cells may store more than two bits of data, such as three, four, and more. And, the principles of the invention would also apply. As the number of bits that can be stored in a single multistate cell increases, the advantages of the architecture in FIG. 3 over that in FIG. 1 also increase.

There are temporary storage circuits or four data latches 306, 309, 314, and 322 associated with and connected to each read-write circuit. The temporary storage circuits may be any circuitry used to hold data for the memory cells. In a specific implementation, the temporary storage circuits are latches. However, other types of logic may also be used. The connection is not shown. Each latch is connected to one of four input lines, 333, 336, 338, and 340. These input lines are lines used to input data into the latches. Data is loaded into a particular latch based on an ENABLE signal input of each latch (not shown). When the LOAD signal is asserted (active low or active high signal) for a particular latch, then that latch is loaded.

In the figure, the input lines are shown running on top of the latches. They may also run beside the latches. Also, in other embodiments of the invention, there may be a single input line and data from the input line is shifted into the latches serially.

Figure 4:
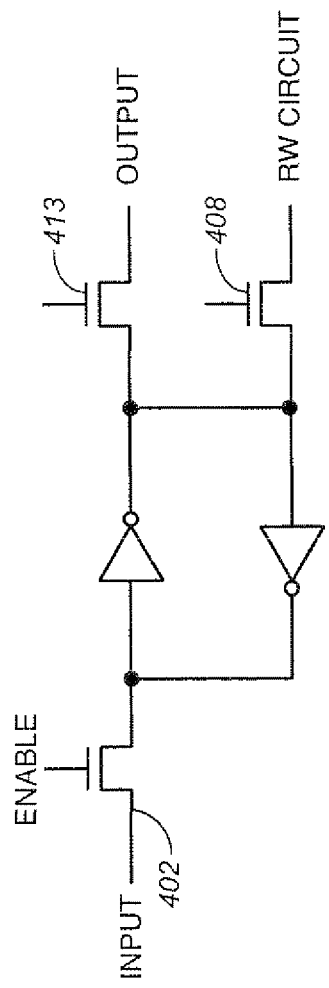
FIG. 4 shows an implementation of a latch.

An example of a specific circuit implementation of a latch is shown in FIG. 4. Other circuit implementation for a latch may also be used. An input 402 is the input of the latch and will be connected to an input line. The ENABLE signal is connected to a pass transistor or pass gate that allows data to be connected to or disconnected from input 402. This latch circuit includes cross-coupled inverters to hold data. The latch also connects to the read-write circuit so that data may be passed between the circuits (such as by using pass transistor 408). The latch also connects to the output through a pass transistor 413. There are other possible implementations. For example, an input/output (I/O) line may be used, so only one of the pass transistors 402 or 413 is needed. The single pass transistor would connect the latch to the I/O line. Further, instead of inverters, other logic gates may be used, such as NAND, NOR, XOR, AND, and OR gates, and combinations of these.

Note that this circuitry contains half the circuitry of a master-slave register as shown in FIG. 2. The master portion of a master-slayer register is one latch, and the slave portion is another latch.

Also, the implementation shows an NMOS or n-channel pass transistor. There are many ways to form a pass gate, and any of these techniques may be used. For example, a CMOS pass gate may be used. A CMOS pass gate includes NMOS and PMOS transistors connected in parallel. Also, a high voltage pass gate may be used. For example, a high-voltage NMOS pass gate is enabled or turned on (or placed in an on state) by placing a high voltage, above VCC, at its gate or control electrode. An NMOS pass gate are turned off or put in an off state by placing its control electrode at VSS or ground.

The circuitry in FIG. 3 further includes a shift register 346, one stage for each read-write circuit. This shift register is similar to one shift register of FIG. 1. The output of each shift register stage is connected to the ENABLE signal input of the particular latches that stage is associated with.

In this particular embodiment, each read-write circuit is connected to and has four latches associated with it. Two of these latches are used to hold the data to be written into the memory cell. Two latches are used to load the data to be written into the memory cell during the next write cycle. For example, latches 306 and 309 may be used to hold write data, and latches 314 and 322 may be used to hold load new data. Accordingly, during the read mode, two latches are used to hold and unload current data, while new data is prepared in the other two latches.

The write data is input into the latches via the appropriate input lines and then written using the appropriate read-write circuit into the memory cells. Data from the memory cells is read out using the sense amplifier and stored into the latches. The read data is output from the latches using the appropriate output lines. The communication line between the latch and the read-write circuit as well as the output line is not shown.

Data is input from the latches one at a time using the input lines. This is done by using an ENABLE signal, so that the latches associated with a read-write circuit or column in the array are connected to the input lines one at a time. The ENABLE signal for the latches comes from the shift registers. The shift registers are loaded with a pattern (for active high logic) which is all 0s, except for one 1 (e.g., 0001000000). This bit may be referred to as a strobe bit. For example, shift register associated with the first column has a 1, and the rest of the shift register contain 0. This 1 is connected to the ENABLE input of the latches for the first column, which connects one or more of these latches to the I/O lines 333, 336, 338, and 340. Data can be read or written to this column. The input to the shift register is connected to 0 and the shift register is clocked. The 1 propagates to the next shift register stage. This 1 is connected to the ENABLE input of the latches for the second column, which connects these latches to the I/O lines. This operation continues until the desired data is read or written from the latches.

Figure 5:
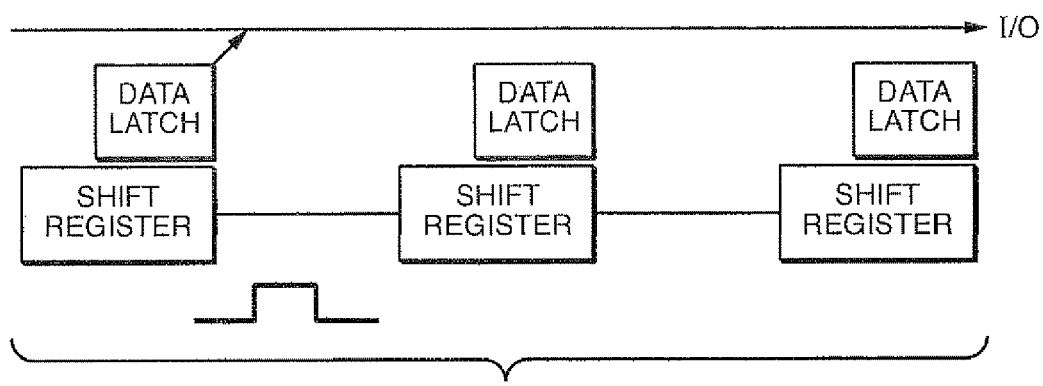
FIG. 5 shows connecting a first data latch to an I/O line by placing a 1 in a first stage of a shift register.
Figure 6:
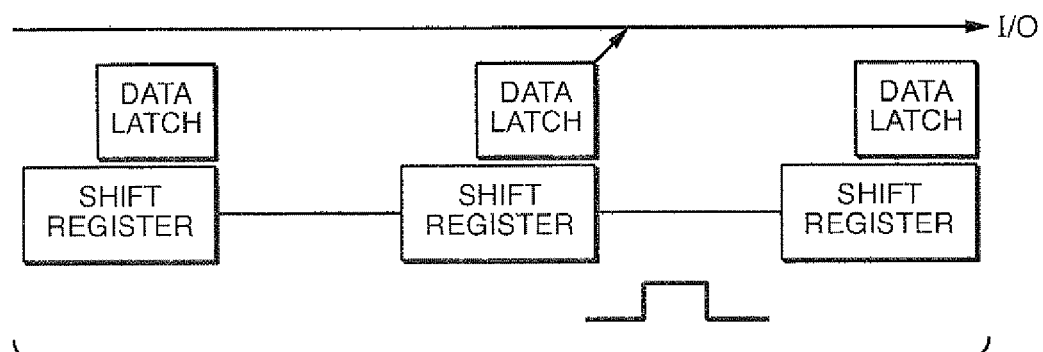
FIG. 6 shows connecting a second data latch to the I/O line by placing a 1 in a second stage of a shift register.

FIGS. 5 and 6 show more clearly the operation of latches and shift register. In FIG. 5, the first shift register has a 1; the data latch associated with that shift register and column is connected to the I/O line. In FIG. 6, the shift register has been clocked, and the next shift register has the 1; the data latch associated with that shift register and column is connected to the I/O line.

The circuitry may also be designed for an active low LOAD signal. Then, the shift register will contain all 1s and a 0 for the particular latches to be enabled (e.g., 1110111111).

For multistate (or multibit) memory cells that hold more than two bits per cell, there would be an additional latch for each additional bit. For example, for three bits per cell, there would be an additional two latches. Three latches for outputting data, and three latches for preparing data, or three to write, three to input new data for the next cycle. Only one shift register is required to provide an enable signal.

The embodiment of FIG. 3 shows a separate set of latches for shifting in or out (loading/unloading) data and the actual operation. In other embodiments, one set of latches may be shared to handle serially the shifting and this will save integrated circuit area. However, by having individual sets of registers for read and write, this improves performance because both types of data may be input and output at the same time.

Compared to FIG. 1, the circuitry in FIG. 3 requires less integrated circuit area to obtain the same functionality. And, the integrated circuit area savings increases as the number of bits stored per memory cell increases. This is because a latch takes up about half the area as a master-slave register. For FIG. 1, the number of latches used per column is given by A=d*4 per column, where d is the number of bits stored in a single memory cell. For FIG. 3, the number of latches used per column is given by B=d*2+2. The table below summarizes the integrated circuit area savings by number of latches. As can be seen, as d increases, the integrated circuit area savings of approach B over approach A increases. And, there may be further integrated circuit area savings depending on the number of columns.

TABLE

| D<br>Number of<br>Bits per Cell | A<br>Number of<br>Latches Using<br>Shift Registers | B<br>Number of Latches Using<br>Dynamic Column Block<br>Selection |
|---|---|---|
| 2 | 8 | 6 |
| 3 | 12 | 8 |
| 4 | 16 | 10 |
| 5 | 20 | 12 |
| 6 | 24 | 14 |
| 7 | 28 | 16 |
| 8 | 32 | 18 |

Another advantage of the FIG. 3 approach over that in FIG. 1 is a reduction in the amount of noise generated. When propagating a 1 (or 0 for active low) through the shift register to enable one set of latches, only one bit is being switched for each clock. Furthermore, only one set of latches is being connected to the I/O lines at a time. Both these contribute to reduce the amount of noise when inputting and output data from the memory cells. By reducing the amount of noise, this improves the reliability of the integrated circuit since it will be less like that data will be corrupted by noise.

In summary for the approach in FIG. 3, data are stored in latches instead of shift registers. In addition to the data latches, there is one chain of master-slave shift registers. A strobe pulse is shifted through these registers and points, with each clock, at a different latch, in sequence. That particular latch will be then connected to an input or an output line. So, in read, the selected latch will send the stored information to the output buffer, and while in programming, the selected latch will receive data from an input buffer.

Starting with two bits per cell, area can be saved with the approach of FIG. 3. In the approach of FIG. 1, a set of four master-slave shift registers, or eight latches, is used. Two set/reset registers (four latches) are used to store read or programming data, and two set/reset registers (another four latches) are used to shift in data during stream write, which provides for increased performance.

With the approach of FIG. 3, only six latches are necessary: Two latches (shift register) are for the shifting the strobe. Two latches are for storing old data, and two latches are for loading new data.

Furthermore, the circuitry of FIG. 3 is comparatively very quiet: one clock signal and one latch output switching (for the strobe) plus two I/Os to be driven, compared to six clocks and thousands of latches switching at a time.

There are many possible embodiments of the present invention. One embodiment may use a combined input/output (I/O) line to input and output data to the latches. There may be one I/O line for each latch or there may be one I/O line for two or more latches. For example, there may be one I/O line that is shared by four latches. Or there may be four I/O lines and four latches.

Figure 7:
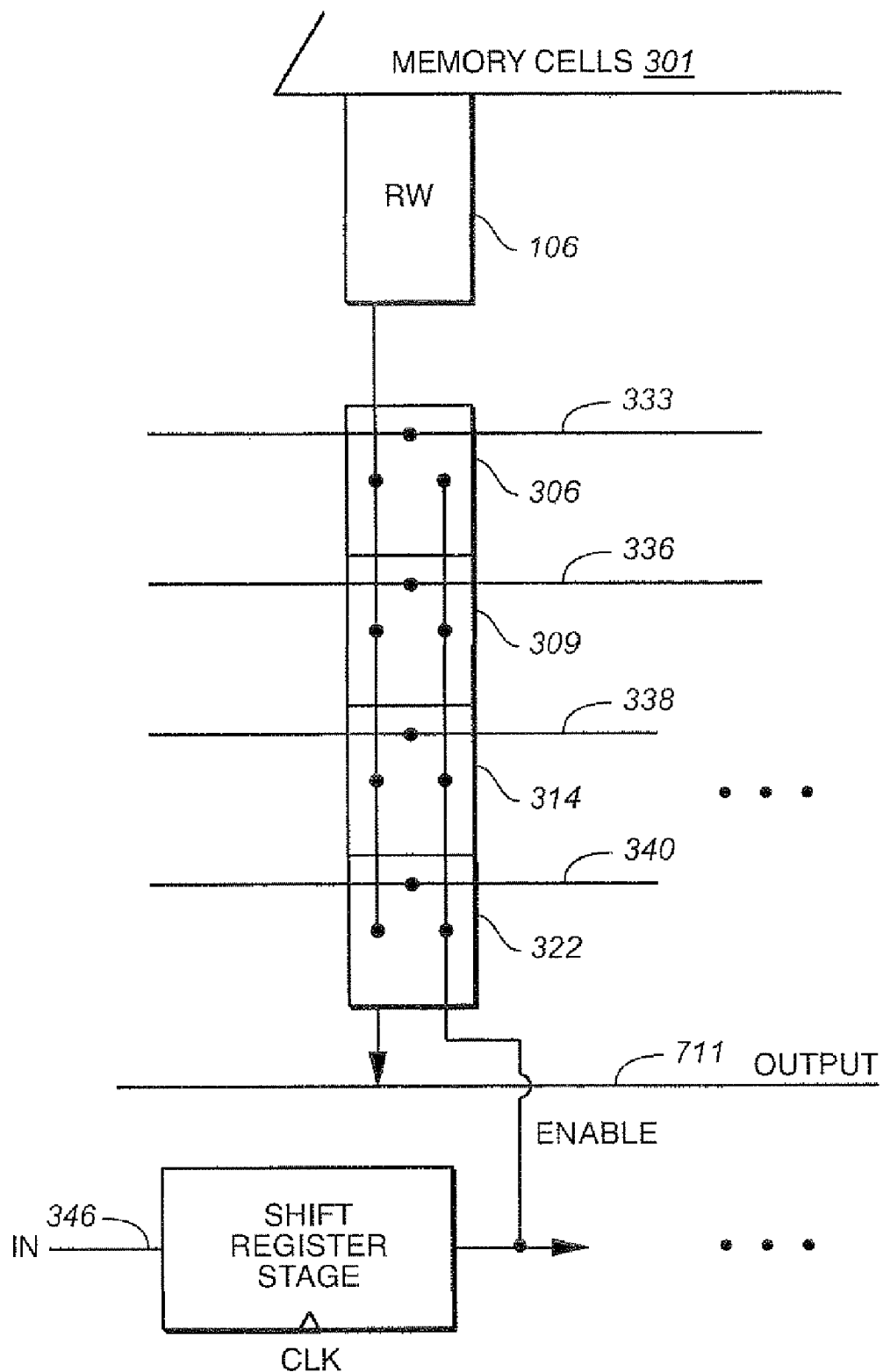
FIG. 7 shows an embodiment of the invention with multiple input lines and a single output line.

FIG. 7 shows the details of another embodiment of the invention. There are four input lines 333, 336, 338, and 340 for four latches 306, 309, 314, and 322, respectively. There is a single output line 711. When a particular column of latches is enabled using the ENABLE signal from the shift register, the data on an input line is connected to and stored in a respective latch. This data in the latches may be connected to the read-write circuit 106 for writing the data into the memory cells.

This implementation includes a single output line where data from the latches are output. Another embodiment may have four output lines, one for each of the latches. However, having more lines does impact die size, and having fewer lines produces a more compact layout.

Figure 8:
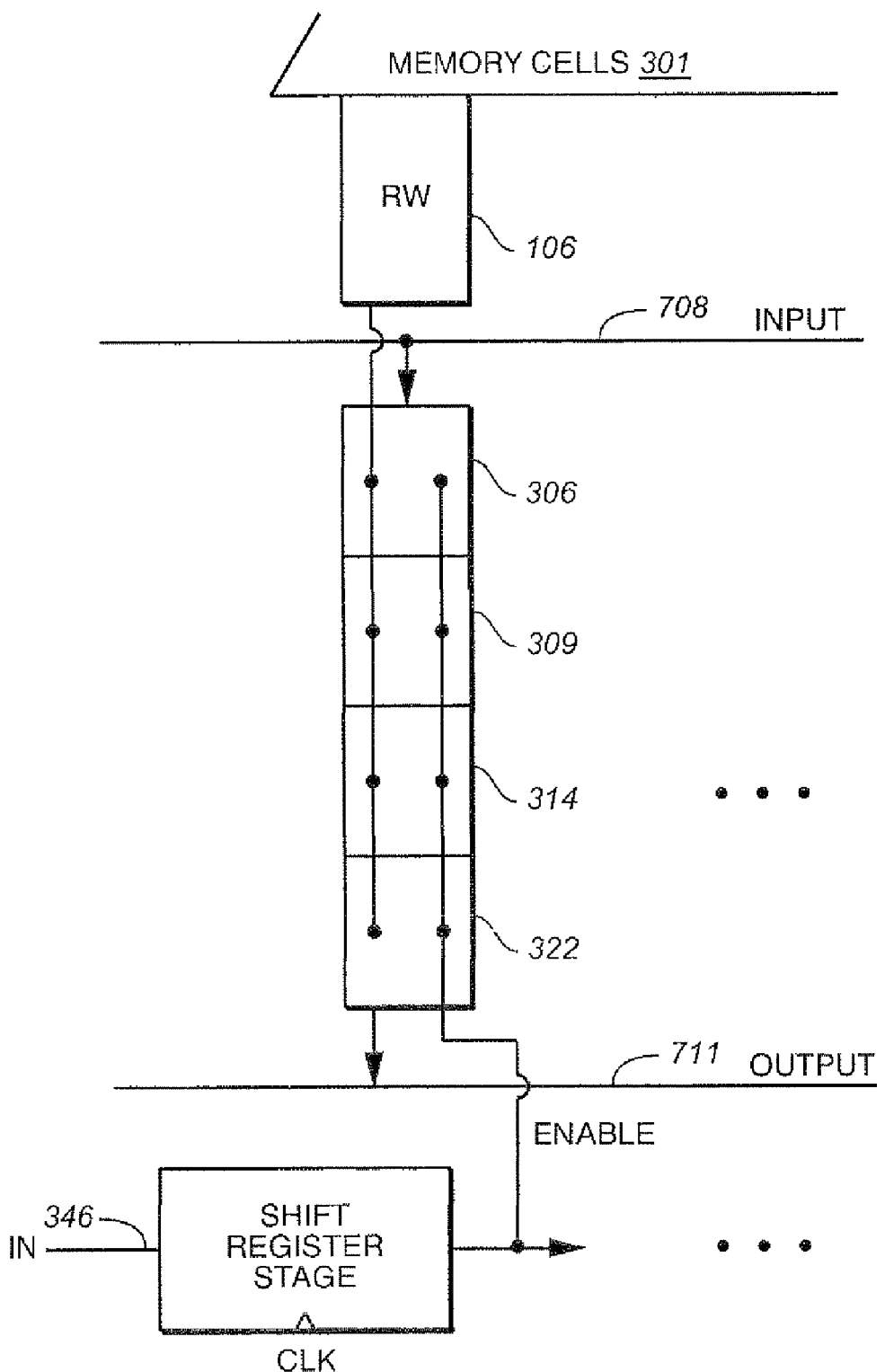
FIG. 8 shows an embodiment of the invention with a single input line and a single output line.

FIG. 8 shows another embodiment of the invention. There is a single input line 708 that is shared by the four latches 306, 309, 314, and 322. The data from the input line may be transferred to each latch. Compared to the FIG. 7 implementation, because there is a single input line in FIG. 8, this implementation provides a more compact layout.

As illustrated by these specific embodiments, there is a multitude of permutations of the present invention. For example, there may be a single I/O line for two or more latches. There may be a single I/O line for each latch. There may be one input line for two or more latches. There may be a single input line for each latch. There may be one output line for two or more latches. There may be a single output line for each latch. And each of these embodiments may be combined with others. For example, there may be one output line and one input line. There may be one input line and four output lines.

FIGS. 9-12 show examples of a circuit architecture in which the present invention could be applied and are adapted from the foregoing discussion. FIGS. 9A-C show examples of a circuit for reading and writing data to memory cells 1301 of an integrated circuit. The integrated circuit may be a memory such as a Flash chip or may be an integrated circuit with an embedded memory portion, such as an ASIC or microprocessor with memory.

Read-write (SA) circuits 1303 are coupled to columns of one or more bit lines of memory cells. The read-write circuits are used to read the states of the memory cells. The read-write circuits may be also used to write or store data into the memory cells. The read-write circuitry may include sense amplifier circuits.

Figure 9A:
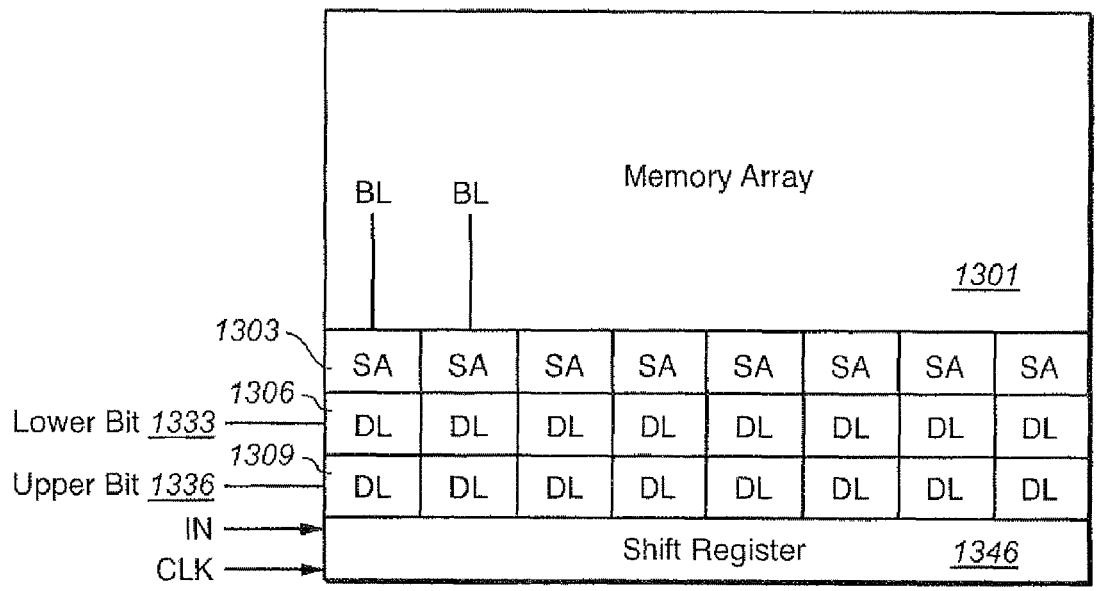
FIGS. 9A-C show integrated circuits with latches for holding data to be read and written into the memory.
Figure 9B:
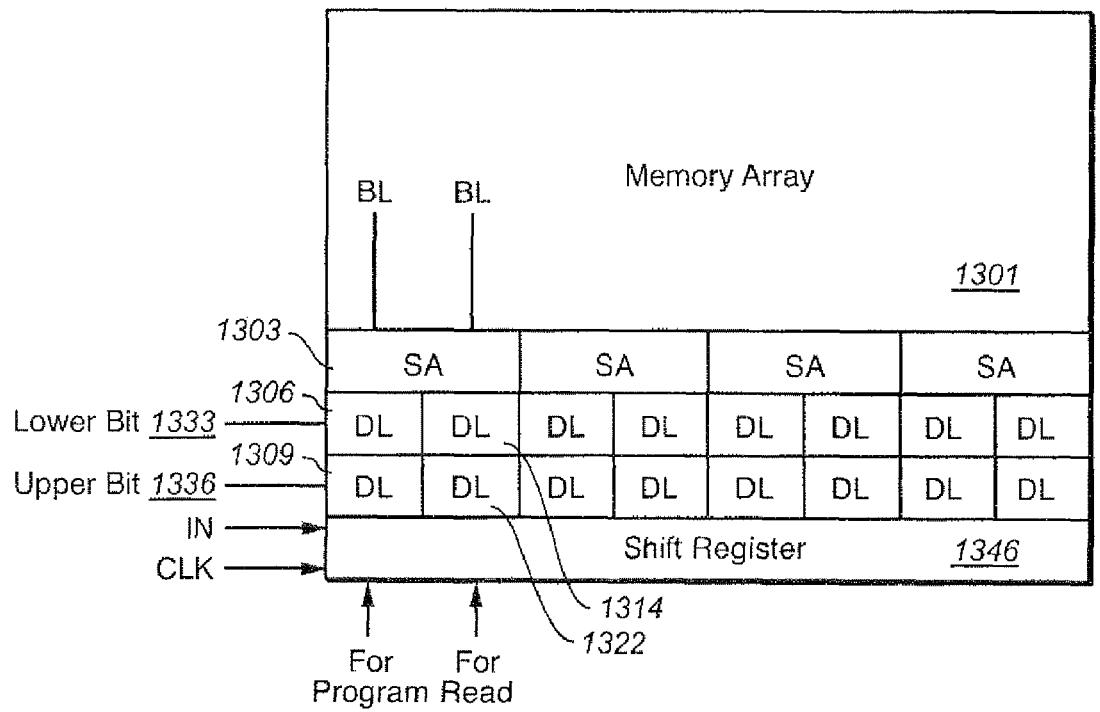
Figure 9C:
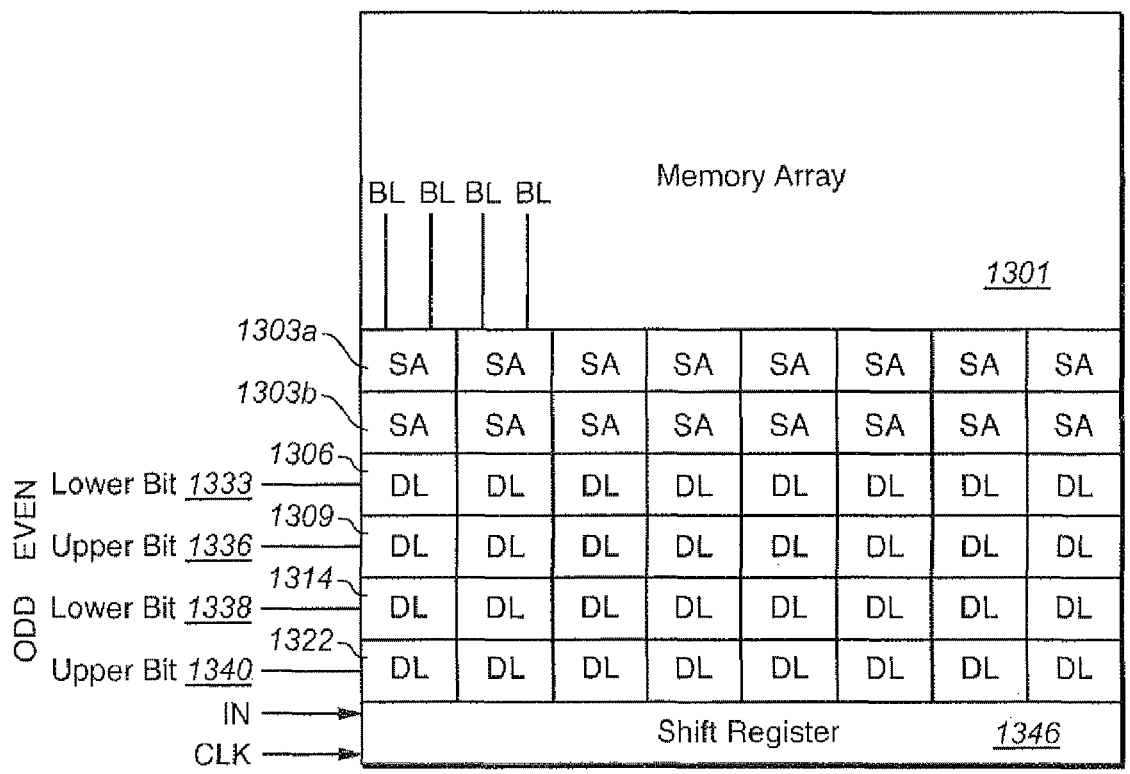

A number of arrangements can be used for the latches and column select circuits. The embodiments of FIGS. 9A-C present different arrangements of the read-write circuit for the columns of memory cells. One arrangement is a "flat" structure, with each bit line having its own set of latches that can be directly accessed, either to load or output data, for transferring data to an input/output line in response to an enable signal from a column select circuit. In other embodiments, one read-write circuit may be shared among two or more columns of memory cells.

In the exemplary embodiments, the storage units are multistate, capable of storing multiple bits of data per cell. For the purpose of serving as an exemplary embodiment to illustrate the principles of the invention, memory cells 1301 of FIGS. 9A-C are dual-bit Flash EEPROM memory cells, so that the collection of memory cells selected by one word line can store either one page of user plus overhead data or two pages of such data, referred to as an upper and lower page. More generally, the concepts readily extend to either binary memory cells or multi-state memory cells that can store more than two bits of data. Similarly, the discussion extends to non-volatile memories with other forms of storage units as the principle aspects of the present invention relate to how the storage units are accessed and arranged, and are not particular to how the data is written to, stored on, or read from the storage units.

In the example of FIG. 9A, there are two temporary storage circuits or data latches DL 1306 and 1309, one for the "upper" bit and one for the "lower" bit associated with and connected to each read-write circuit SA 1303. The temporary storage circuits may be any circuitry used to hold data for the memory cells. In a specific implementation, the temporary storage circuits are latches; however, other types of logic may also be used. Each latch is connected to one of two input/output (I/O) lines, 1333 and 1336, used to input and output data into the latches. The details of the connection are not shown. In this simplified example, the latches and lines serve both the input and output function, although separate lines can also be used.

In the data input process, data is loaded bit-by-bit or more commonly byte-by-byte into the data latches. The Y-select circuits, such as 1346, are used to manage which byte is selected at a specific WE (write enable) clock. Data is loaded into a particular latch based on a WE signal input of each latch (not shown in FIG. 9). When the WE signal is asserted (active low or active high signal) for a particular latch, then that latch is loaded. For example, in FIG. 9C the Y-select circuit 1346 will select a particular data set on the I/O bus (lines 1333, 1336, 1338, 1340) that will then be connected to the selected data latches (1306, 1309, 1314 and 1322), which can be similar to those in FIG. 10.

In the data output processes, the data can be read out serially from a column of registers at a time. The Y-select will select a byte at a specific RE (Read Enable) clock. The data will transfer from the data latch to the I/O bus and from there the data will be transferred to the output buffer.

In FIG. 9B, each input/output circuit 1303 has four associated data latches, 1306, 1309, 1314, and 1322, with the first two respectively corresponding to the lower and upper bits for programming and the second two respectively corresponding to the lower and upper bits for reading.

In a folded structure, such as FIG. 9C, multiple input/output circuits such as 1303a and 1303b are stacked on top of each other. In this example, one of the input/output circuits belongs to an odd bit line and the other belonging to an even bit line. In a two bits per cell arrangement, there is a corresponding upper bit and lower bit data latch for each input/output circuit. As in FIG. 9A, the same latch is used for both the read and program data, although in a variation separate data latches for program and read can be used. Since this is a folded structure, the strobe pulse of the shift register will travel first in one direction, say from right to left, to access one of the bit lines, and when it meets the (counter defined) boundary, the strobe will turn around to go from left to right to access the other of the bit lines.

The I/O connections can have several options. In one case where the two bits stored in one physical cell belong logically to the same page and are written at the same time, it may be convenient to use two I/O lines, 1333 and 1336, to load the corresponding data latches 1306 and 1309 simultaneously (FIG. 9A). In the case of separate data latches for program and read as in FIG. 9B, the data latches 1306 and 1309 for program may be connected to DIN lines (Data In lines from input buffer), and the data latches 1314 and 1322 used for reading may be connected through I/O lines to output buffers.

In another case often used in traditional NAND architectures, as described in U.S. patent application publication no. 2003/016182, which publication is incorporated herein by this reference, the lower bit data and upper bit data stored in each physical cell logically belong to different pages and are written and read at different times. Therefore, the lower bit data latch and the upper page data latch will be connected to same I/O line.

Figure 10:
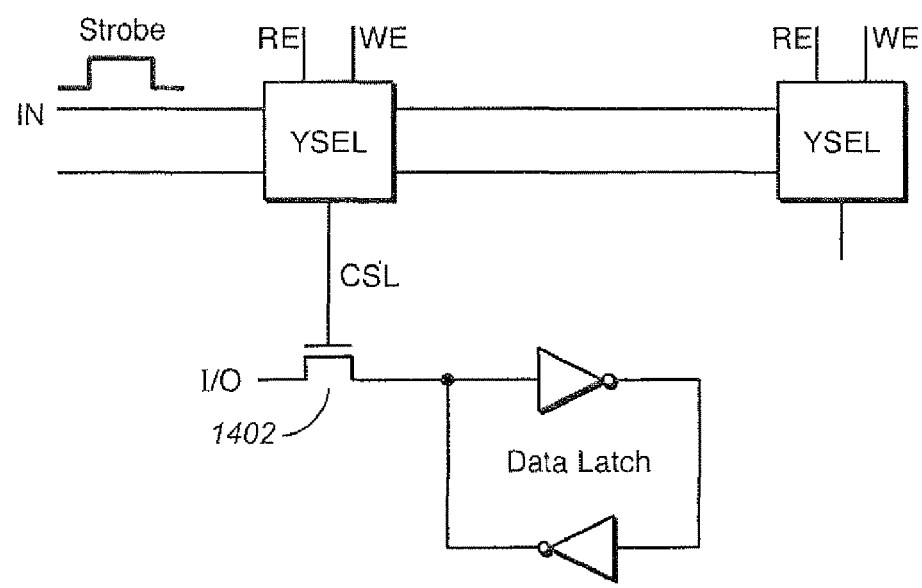
FIG. 10 shows an implementation of a latch.

An example of a specific circuit implementation of a latch is shown in FIG. 10. An input I/O is the data input to the latch, such as 1306, and will be connected to an input line, such as 1333. The column select signal CSL is connected to a pass transistor or pass gate 1402 that allows data to be connected to or disconnected from the input. The signal CSL is supplied from the Y or column select circuit YSEL that corresponds to one stage of the shift register 1346 of FIGS. 9A-C. This example of a latch circuit includes cross-coupled inverters to hold data and also connects to the read-write circuit so that data may be passed between the circuits. Other circuit implementations for a latch may also be used, such as NAND, NOR, XOR, AND, and OR gates, and combinations of these.

In this example, a read enable signal RE and write enable signal WE will be the clock to control the YSEL. A strobe will propagate along the YSEL stages of the shift register. In the case of a folded structure, when the pulse reaches the last stage, it will propagate back in the other direction. When CSL is high, the data latch will be selected. The I/O line will then get the data from or put the data into the data latch. There are other possible implementations than a single input/output (I/O) line as described with respect to FIG. 9B.

The exemplary embodiment of FIG. 10 shows an NMOS or n-channel pass transistor. There are many ways to form a pass gate and any of these techniques may be used. For example, a CMOS pass gate, that includes NMOS and PMOS transistors connected in parallel, may be used. Also, a high voltage pass gate may be used. For example, a high-voltage NMOS pass gate is enabled or turned on (or placed in an on state) by placing a high voltage, above VCC, at its gate or control electrode. An NMOS pass gate is turned off or put in an off state by placing its control electrode at VSS or ground.

As described above, there are several arrangements for the relation of the data I/O lines and the data latches. If the data latch is "flat", as shown in FIGS. 9A and 9B, then the lines connected to 1306, 1309, 1314, 1322 belong to different I/O lines. In the FIG. 9A embodiment, each read-write circuit is connected to and has two latches associated with it that serve as both input and output latches. Alternately, as in FIG. 9B, two of these latches can be used to hold the data to be written into the memory cell, and two latches are used to hold the data read out of the memory cell.

The write data is input into the latches via the appropriate input lines and then written using the appropriate read-write circuit into the memory cells. Data from the memory cells is read out using the sense amplifier and stored into the latches. The read data is output from the latches using the appropriate output lines. The communication line between the latch and the read-write circuit is not shown.

Data is input from the latches one at a time using the input lines. This is done by using a column select signal (CSL), as described above, so that the latches associated with a read-write circuit or column in the array are connected to the input lines one at a time. The CSL signal for the latches comes from the shift registers. The shift registers are loaded with a pattern (for active high logic) which is all 0s, except for one 1 (e.g., 0001000000). This bit may be referred to as a strobe bit. For example, shift register associated with the first column has a 1, and the rest of the shift register bits contain 0. This 1 is connected to the ENABLE input of the latches for the first column, which connects one or more of these latches to the I/O lines 1333, 1336, 1338, and 1340. Data can be read or written to this column. The input to the shift register is connected to 0 and the shift register is clocked. The 1 propagates to the next shift register stage. This 1 is connected to the ENABLE input of the latches for the second column, which connects these latches to the I/O lines. This operation continues until the desired data is read or written from the latches.

Figure 11:
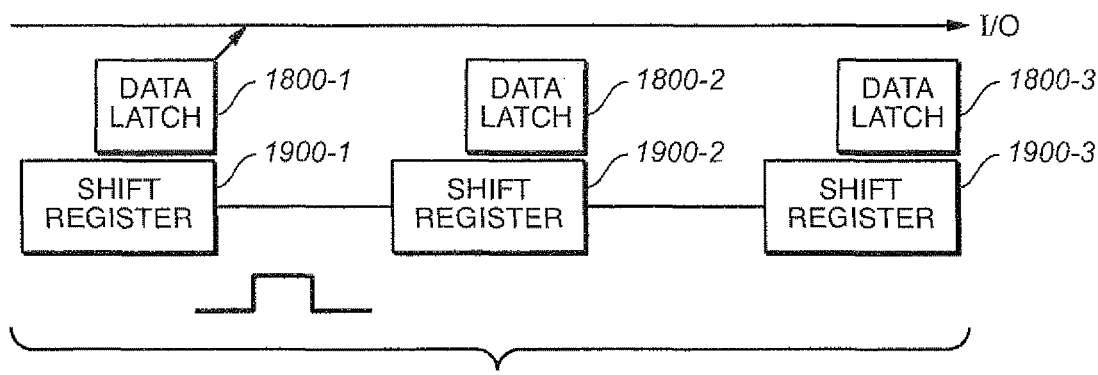
FIG. 11 shows connecting a first data latch to an I/O line by placing a 1 in a first stage of a shift register.
Figure 12:
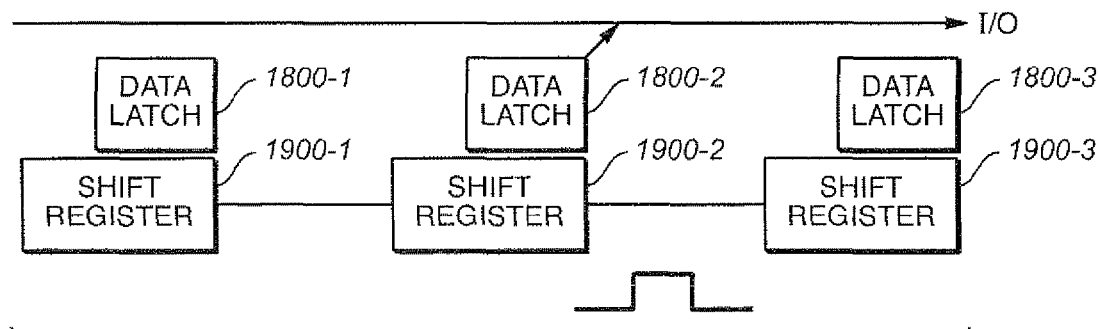
FIG. 12 shows connecting a second data latch to the I/O line by placing a 1 in a second stage of a shift register.

FIGS. 11 and 12 show more clearly the operation of latches and shift register. In FIG. 11, the first shift register has a 1; the data latch associated with that shift register and column is connected to the I/O line. In FIG. 12, the shift register has been clocked, and the next shift register bit has the 1; the data latch associated with that shift register and column is connected to the I/O line. The circuitry may also be designed for an active low LOAD signal. Then, the shift register will contain all 1s and a 0 for the particular latches to be enabled (e.g., 1110111111).

The preceding discussion illustrates the general principles involved and assumed that there is one (or two) bit lines per sense amp and one shift register stage per one or two sense amps. However, the concept can be usefully generalized such that there is one shift register stage per group of sense amps, the group of bit lines forming a column block. For example, there may be one or a few bytes of data associated with one column block, requiring, for example, 8 to 32 input lines in place of the one to four input lines shown in FIGS. 9A-C. In one specific example following the structure of FIG. 9A, each single bit line would consist of 8 bit lines, Sense Amp 1303 would read from and write to each of the 8 bit lines, each Data Latch 1306 and 1309 would hold 8 bits of data, and the upper bit and lower bit lines 1333 and 1336 would each be 8 bits wide. This allows a byte of data to be entered or read from each column block simultaneously.

In the case where one or more bit lines within a column block is bad, a method can be provided to skip over the bad column block. For example, in the scheme of FIGS. 9-12, if one column within the column block associated with shift register 1900-2 and data latch 1800-2 were bad, then the memory needs to skip the entire column block. According to one aspect of improvements further described in U.S. Pat. No. 7,170,802, incorporated above by reference, the pulse of FIG. 11 passes through shift register 1900-2 without waiting for a second clock pulse and without selecting the latch 1800-2 to supply data to the I/O line. According to another aspect of those improvements, shift register 1900-2, data latch 1800-2, and the column block with which they are associated, in effect, become transparent as seen from the memory controller or the host.

Alternate Column Selection Schemes

This section presents some variations on the basic column select mechanism described above that can used to improve performance. As described above, when accessing the stacks of input/output circuits connected to the bit lines of the memory array, a shift register is used and selection is made based on a strobe signal traversing the array. As discussed with respect to FIGS. 10-12, this strobe pulse travels through the shift registers enabling each set of data latches in order, moving from one end to the other, at which point it loops back at the beginning and starts over until all of the desired data is accessed. The present section modifies this basic arrangement: in one set of embodiments, part of the bit lines (e.g., every other register stack) are along a row accessed as the pointer movers across in one direction, after which the pointer traverses the array in the other direction with the rest of the bit lines being accessed on the trip back. In another set of embodiments, the sets of read/write stacks split into two groups that are each accessed by a pair of interleaved pointers clocked at half speed, with their contents then combined for the output at the standard clock speed.

In the following discussion, the exemplary embodiment below will be based the sort of pointer structure described above and also developed in U.S. Pat. No. 7,170,802, with further detail on appropriate read/write circuitry and register structures given in U.S. Pat. No. 6,983,428 and U.S. patent application Ser. No. 12/478,997, filed Jun. 5, 2009. And although the following discussion is given in the context of the pointer based dynamic column selection presented above, the techniques presented below can be applied more generally; for example, even if the columns of an array are randomly accessible, the columns may be split into two groups that have interleaved half-frequency clocking.

For memory devices, such as NAND or other flash memory products, there is ongoing demand for increasing performance. One of the limitations of device speed is in the transfer of data from data latches to output busses. Similarly, slow data transfer from input busses to data latches will hinder high speed performance. Besides these drawbacks, high speed performance also gives rise to column selection timing challenge during sequential read and write operations. The techniques presented here provide column selection schemes allowing for higher speed performance.

The first set of aspects splits the columns into groups with the select pointer accessing a first group while traversing the array in a first direction, reversing the pointer at the end, and accessing a second group on a way back. The exemplary embodiment splits the columns in half, reading every other column (or group of columns) as the pointer moves from the first column in the array until the end, and picking up the other half on the way back before moving on to the next row. More specifically, it will usually not be individual columns that are accessed, but groups of columns. As discussed above, and developed in more detail in U.S. Pat. Nos. 6,983,428 and 7,170,802, a number (e.g. 16) of columns are grouped together and accessed by a shared read/write stack elements in order to save die space. The memory cells may be binary or multi-state. When multiple bits are grouped together or cells are read in a multi-state format, or both, when a read/write stack is accessed, multiple bits (stored in a corresponding number of "tiers") will be transferred between temporary data storage devices or registers in the read/write stack and corresponding the data bus. Under the earlier arrangement, the pointer works through all the column groups a tier at a time, looping back after the last group and then proceeding through the next tier. Improvements in speed performance are limited because of pointer set up and hold issues while pointer is looped, for example due to RC loading on the pointer path.

Figure 13:
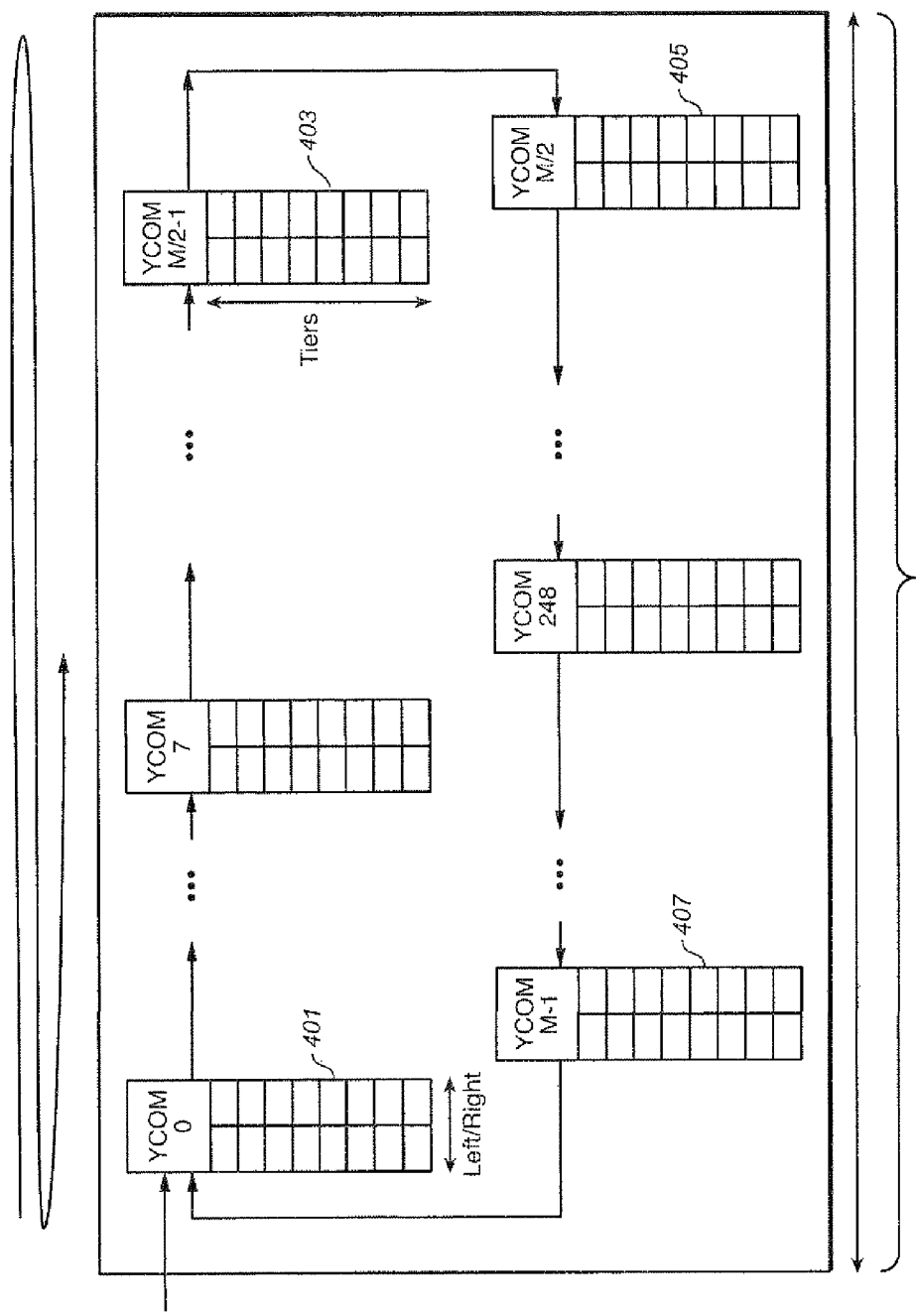
FIG. 13 illustrates embodiments where the pointer accesses the column in a loop-like arrangement.

In the first set of embodiments, a pointer scheme is introduced where the pointer shifts smoothly without gaps until all the columns in a page are accessed. Columns are preferably not grouped into separate large column groups (data groups) because this affects speed performance. With large column groups, the pointer needs more time to be looped back when accessing columns in the same large data group. In this set of embodiments, columns in one page are grouped together and are connected to each other to form a loop as shown in FIG. 13. In the exemplary embodiment, the pointer is shifted to access one tier at a time and it takes one loop to access one tier. Since there are 16 tiers in this example, 16 loops are required to cover all the columns in a page, after which the pointer moves to the next word line.

FIG. 13 illustrates how the pointer travels through the read/write stacks. Each of the groups YCOM 0 to YCOM (M−1) (401, . . . , 403, 405, . . . , 407) would correspond to the stacks between array 1301 and shift register 1346 of FIG. 9C, but with these other elements suppressed for the purposes of this discussion. The boxes of each of the 401-407 represent the various tiers they can hold. The group stacks, or column access circuits, YCOM-0 to YCOM-(M−1) (401, . . . , 403, 405, . . . , 407) are shown staggered into two rows for illustrative purposes, but this need not reflect their physical layout on the device. The first group of bit lines (starting at left) would be connected to 401 for group 0, the second group of bit lines would be connected to 407 for group (M−1), and so on with the odd and even sets of groups alternating between the top and bottom rows. (That is, to take the case where each group has only a single bit line for simplicity, column 0 would correspond to group 0, column 1 to group M−1, column 2 would correspond to group 1, and so on.) The number of groups here would correspond to the page size, including user data and, typically, some overhead such as error correction code (ECC) associated with the data.

The pointer traverses the groups from group 0 401 to group (M/2−1) 403, then, starting at group M/2 405 works its way back to group (M−1) 407, after which it completes one loop which covers all the columns in one tier. In this example 16 loops are required in order to access all the columns in a page. The pointer will traverses its way through the tiers until they are all read out (or all the desired data accessed), before moving on to the next word line. This is illustrated schematically by the arrow at the top of FIG. 13, where the trip from right to left reads out a first left tier, after which it continues again to the right tier.

Consequently, this arrangement is similar to some of the aspects presented in U.S. Pat. No. 7,170,802. More specifically, the use of a pointer moving from left to right through the columns and then moving back right to left is described there with respect to FIGS. 7-13. Leaving aside the redundancy columns features (although these features can also be incorporated here) and just considering the left plane, the techniques described there also have pointer mover left to right, then returning right to left, but on a different row, and continuing in an alternating manner; however in the present case, rather than access even column in both directions (as in U.S. Pat. No. 7,170,802), only the even groups of columns are accessed in one direction, with the odd groups of columns being accessed on the way back. Consequently, much of the structure presented there can be adapted accordingly.

Figure 14:
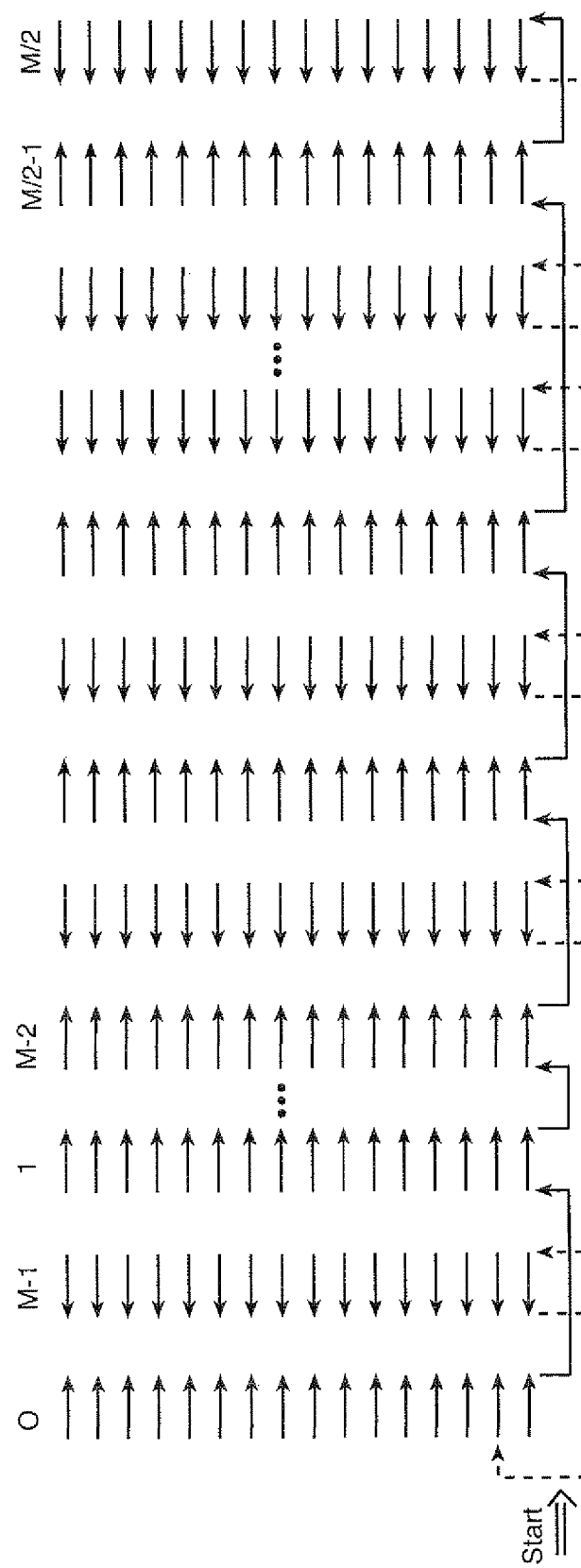
FIG. 14 is a schematic illustration of how the pointer is shifted through the column groups in embodiments like those of FIG. 13.

FIG. 14 is a schematic illustration of how the pointer is shifted through the groups. The columns run from left to right, alternately number in ascending order from 0 and descending from (M−1). The columns of arrows represent the 16 (in this example) tiers in each stack, with the direction of the arrows corresponding to the direction of the pointer movement when the column group will be accessed. The movement of the pointer for one loop, reading out the first tier, is shown along the bottom row: The pointer enters from the left, works its up through groups 0, 1, and so on until group (M/2−1), moves to group M/2, works it way back to column (M−1), at which point it moves up to the next tier and continues. (In an alternate embodiment, multiple or even all of the tiers of each group could be read out before moving on to the next group.)

By looping arranging the pointer in this way, performance can be improved as the need to loop back pointers during serial data input or output operations has been avoided. This can be done without the requirement of a complicated column select scheme or complicated circuits to provide control signals. The layout area for the column selection circuitry is also relatively compact, making it suitable for technologies where the bit line pitch shrinks due to scaling. Additionally, as the pointer moves in a loop, there is no need to detect whether the pointer reaches the edge, which simplifies the control and improves performance.

In a complementary set of embodiments, the use of an interleaved pointer scheme is introduced to improve performance. Previous column selection schemes set a single pointer during read and write operations, where the pointer is used to select columns one at a time. As frequencies increase, the pointer shift setup/hold time margins may not guarantee correct operation of the column selection mechanism. Data access time specifications for output/input busses and data latches may also be violated at high frequencies. To overcome these limitations, interleaved column selection pointers are set.

Figure 15:
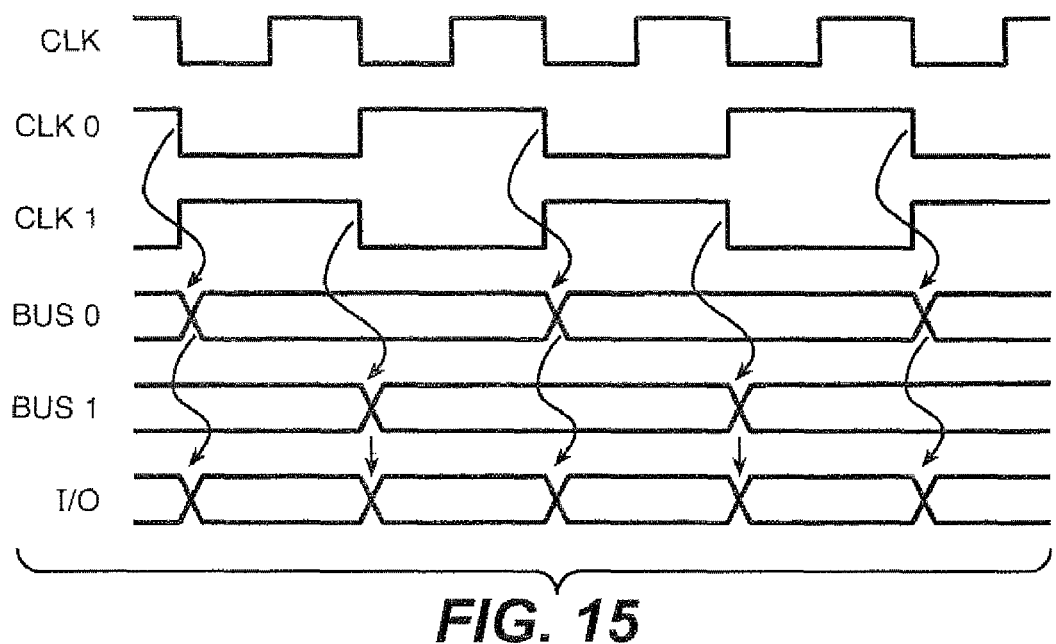
FIG. 15 illustrates some of the timing waveforms for embodiments using interleaved pointers for column access.

In the exemplary embodiment, by way of a frequency divider two sub-clocks with half the frequency of the main clock and a phase difference of 180 degrees are created. Each of the sub-clocks is used to shift one of two interleaved pointers. As each of the pointer is shifted at a lower frequency than that of the main clock, column selection at a higher frequency can be achieved. Similarly, data access specifications are not violated since data transfers between data latches and intermediate buses are done at a lower frequency than that of the main clock. By alternately transferring data from intermediate buses to the I/O bus using the interleaved pointers, higher speed performance can be realized. FIG. 15 illustrates some of the timing waveforms for the clocks, intermediate buses, and I/O buses.

FIG. 15 shows some of the relevant waveforms and their relation to each other for use of the two interleaved column selection pointers. CLK is the basic clock signal from the host or controller. CLK is divided into two sub-clocks CLK 0 and CLK 1 with half the CLK frequency and a phase shift of 180 degrees between them. More generally, the sub-clocks may use a different phase shift and need not have symmetric high and low parts, as long this is accounted for when the internal sub-bus signals are combined. The sub-clocks CLK 0 and CLK 1 are generated from CLK on the memory device in the exemplary embodiment, but, more generally, these could come from the controller or host.

BUS0 and BUS1 are the two intermediate data buses that each receives data from half the bit line groups as governed by the interleaved pointers respectively controlled by CLK 0 and CLK1. Consequently, operations for filling in BUS0 and BUS1 stages are done at half CLK frequency. Here, the intermediate buses BUS0 and BUS1 may be data input buses, output buses, or a combined I/O intermediate bus. If separate input and output buses are used, they can be driven at half the frequency of CLK. The bottom of FIG. 15 is the combined I/O bus, which is again driven at the frequency of CLK. Since the two pointers are interleaved, data is transferred alternatively from BUS0 and BUS1 to I/O bus. (If separate input and output buses are used, the corresponding intermediate buses would be similarly combined.) In a write process, data would be transferred from the I/O bus to BUS0 and BUS1 in an inverse arrangement. Of course, in the interleaving of the sets of waveforms, the correspondence of logical to physical address needs to be kept track of, but if the same interleaving is used in both reading and writing, much of this follows readily.

Under the arrangement of FIG. 15, many of the bottlenecks for increasing speed, such as setup and hold times for data latches and the transfer between latches and data buses, are removed. Since these are clocked at half the frequency of the main clock, the main clock can then be ran faster without running into timing problems with these elements, resulting in overall high speed performance.

The techniques described with respect to FIG. 15 can be embodied in a number of different circuit arrangements. The memory would receive the basic clock (CLK) and either generate from it, or alternately also receive, the two sub-clock (CLK 0, CLK 1). The registers and other circuit elements used to transfer data into, out of, or both in and out of the memory array would then be split into two groups, each governed by a corresponding one of two pointer ran by a respective one of the sub-clocks. Each of these sub groups is then connected to one of the two sub-buses, with the content of the two buses combined onto a single bus clocked at the basic clock frequency. For instance, every other column or column group could alternate between the two pointers, so that every other group stack would be governed by the same pointer. CLK would come into a frequency divider, which could then provide CLK 0 and CLK 1 to govern a corresponding one of the pointers. A corresponding one of the intermediate bus would then be attached to the corresponding subset of the stacks, with the sub buses then combined in a circuit to the combined bus clocked by CLK. Returning to FIG. 13, this arrangement would schematically to the upper half of the stacks being governed by the pointer using CLK 0 and connected to one sub-bus, and the lower half of the stacks being governed by the pointer using CLK 1 and connected to the other sub-bus (where, again, although shown staggered in FIG. 13, this may not represent the physically arrangement of the register stacks on a device). Another arrangement, in which the array is split into left and right halves, will be describe with respect to FIG. 16. It should also be noted that although the exemplary embodiments are based on splitting the bit line groups into two and using a two sub-clocks at half-frequency of the basic clock signal, the basic concept can be extended to three or more subdivisions of the data transfer circuits and bit lines using a corresponding number of lower frequency sub-clocks.

Figure 16:
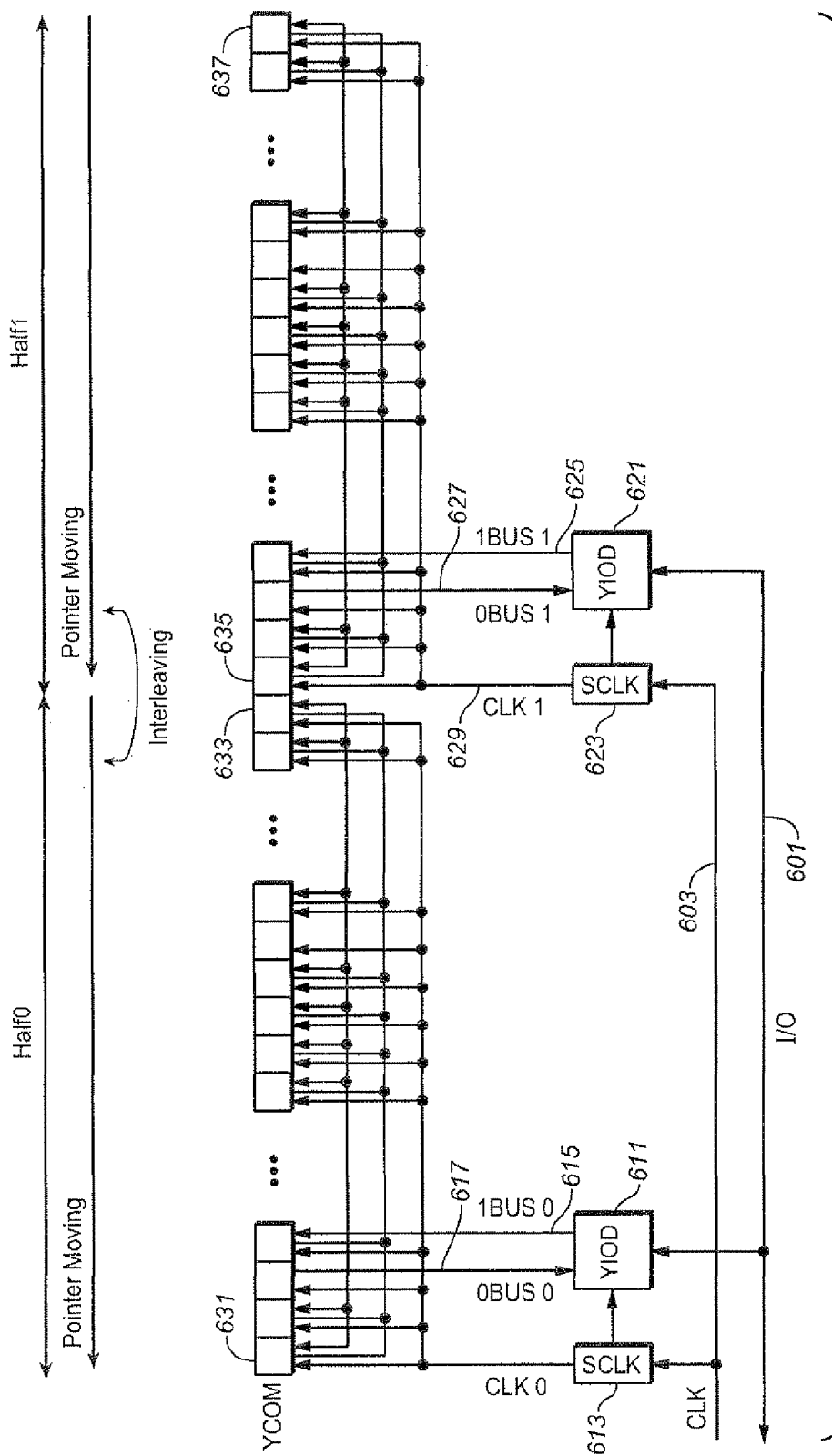
FIG. 16 is a schematic representation of circuit elements for an embodiment using interleaved pointers for column access.

FIG. 16 is a schematic representation of an embodiment where the access circuitry for the columns of array is split into two halves (Half0, Half 1). The group stacks are shown as YCOM, with only the first, middle pairs (where the right and left half meet), and last explicitly numbered as 631, 633, 635, and 637, respectively. Each stack would then be connected to the one or more columns that make up a column group, with exemplary being such as those described in U.S. Pat. Nos. 6,983,428 and 7,170,802. (The columns themselves, as well as the rest of the array, are not explicitly shown, but only indicated schematically as the two halves Half0 and Half1.) The exemplary embodiment has separate intermediate data buses for input and output. The column stacks of Half 0 are connected to input bus IBUS0 615 and output bus OBUS0 617, and the column stacks of Half1 are connected to input bus IBUS1 625 and output bus OBUS1 627. Sub-clocks CLK 0 and CLK 1 are respectively supplied to the column stacks of Half0 and Half1 on 619 and 629. Here the two interleaved pointers are taken to move from right to left, starting at stacks 633 and 637 in Half0 and Half1, respectively, as the stacks are accessed at the half-frequency clocks until stacks 631 and 635 are reached, at which point the process repeats until all the wanted data is accessed.

The sub-clocks CLK0 and CLK 1 are respectively generated from CLK in SCLK 613 and SCLK 623. Here these are shown as separate elements, although in other embodiments a single circuit element may generate both or, alternate, CLK 0 and CLK 1 may be provided from off circuit. The intermediate buses OBUS0 617 and IBUS0 615 are connected to the I/O bus 601 by YIOD 611, which is also connected to receive the clock signal from SCLK 613, with YIOD 621 performing the same function for Half1. YIOD 611 and YIOD 621 serve to combine the output of the intermediate data buses OBUS0 617 and OBUS1 627 onto I/O 601 in a read process, and distribute the incoming data from I/O 601 onto IBUS0 615 and IBUS1 625 in a write process. Although shown separate here, 611 and 621 could be implemented as a single circuit element.

Figure 17:
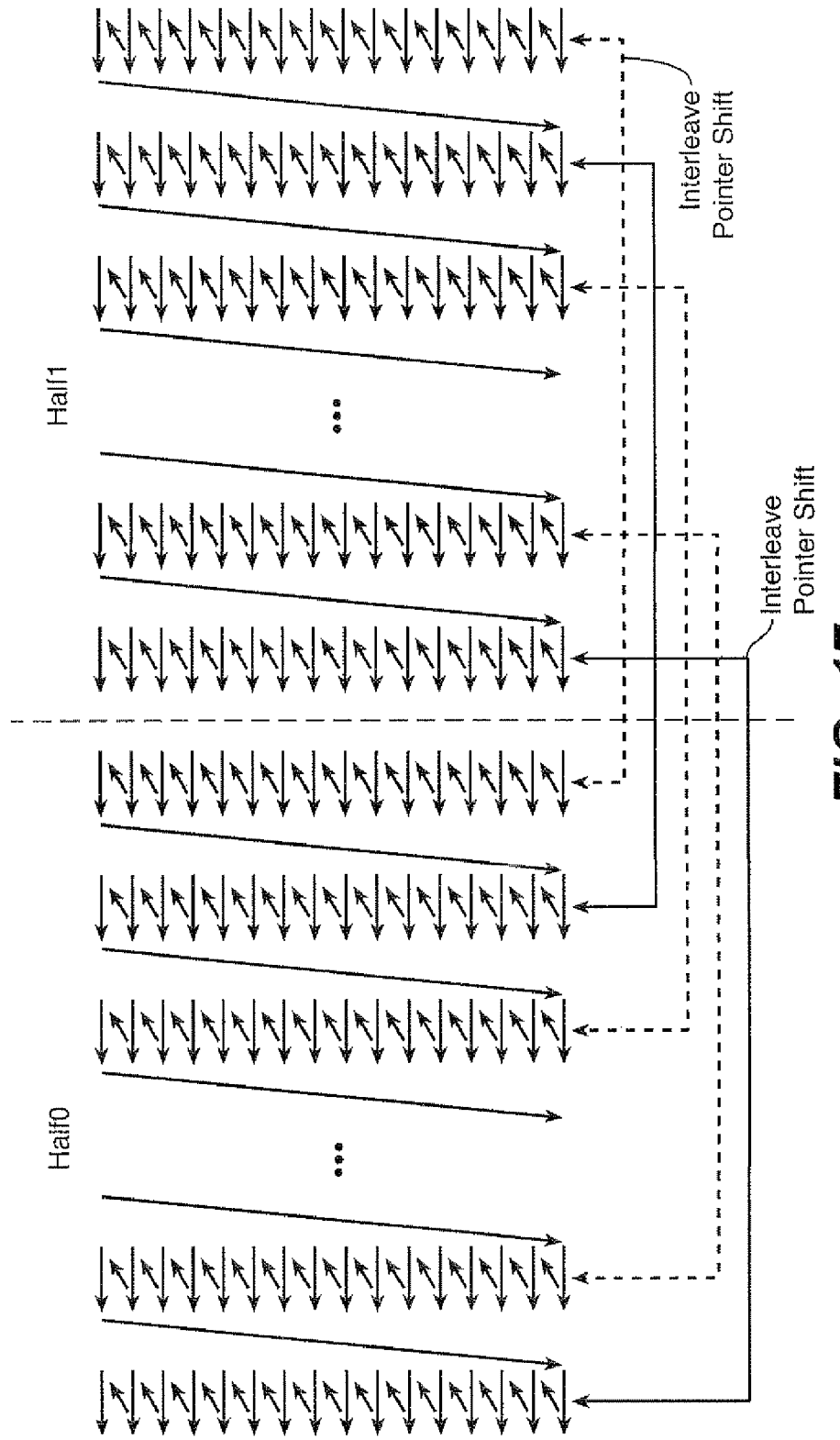
FIG. 17 is a schematic illustration of how the pointer is shifted through the column groups in embodiments like those of FIGS. 15 and 16.
Figure 18:
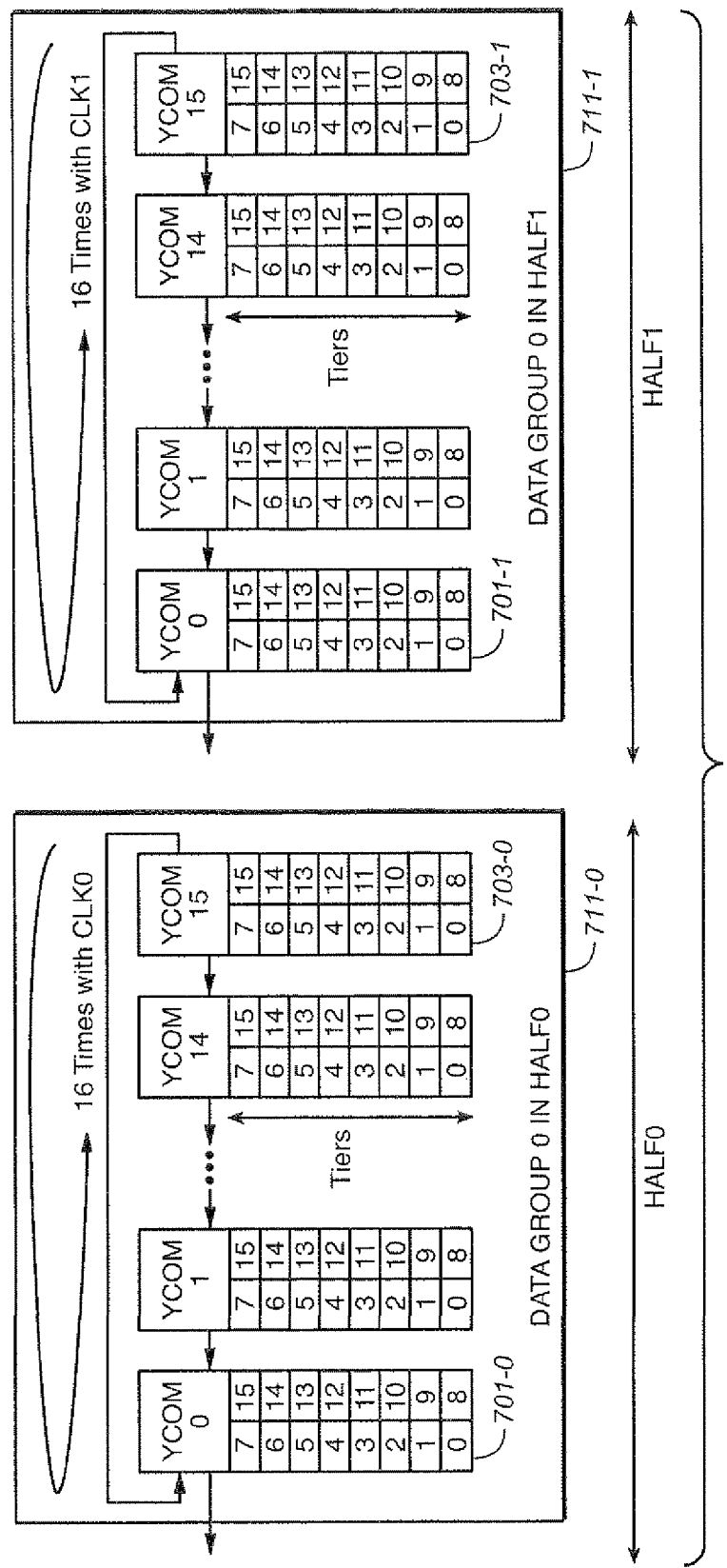
FIG. 18 illustrates embodiments where the pointer accesses the column using interleaved pointers.

FIGS. 17 and 18 are schematic illustrations of how the tiers of the various stacks can be read out using interleaved pointers. In FIG. 17, the stack tiers of the two halves are represented similarly to in FIG. 14, while FIG. 18 represents the group stacks, or column access circuits, similarly to in FIG. 13.

The different tiers in each groups stack are represented by the arrows, with the columns themselves representing the stacks. Starting at left in each half, as point shifts through the stacks are accessed, each one tier per stack before moving on to the next stack or, in an alternate embodiment, all the tiers of each stack are read before the pointer shifts. Control signals can then let the memory know when to mover to the next tier and to the next stack.

In FIG. 18, the arrangement of the group stacks, or column access circuits, YCOM are illustrated schematically for an example where each half has 16 groups, each having 16 tiers. As the memory now has two interleaved pointers, two data groups are read out at the same time with the interleaved pointers taking turns to put data on the common bus from HALF0 711-0 and HALF 711-1. In this example, 32 columns from the same tier (16 from each data group) are read out before moving on to the next tier, starting with tier 0 in YCOM 703 and working across to YCOM 701. With this arrangement, 32 YCOMs in the same tier are read out before moving on to the next tier. The two pointers will shift to the next two data groups (one from each half) when all tiers of the first two data groups are read out. This is repeated until all the columns in a page are read out.

Returning to FIG. 16, this shows the pointers as moving from right to left for the interleaved scheme, although in other embodiments they may go the other directions, as in the earlier described approaches. One set of preferred embodiments allows for the option of a non-interleaved scheme for all or part of an array: for example, the array may incorporate a redundancy area for spare columns to replace defective ones, similar to that described in U.S. Pat. No. 7,170,802, where the interleaved scheme is employed for the main area, but not in the redundancy area. In a common arrangement where much of the row or X circuitry is placed to the left of the array, on the right side, being far away from this peripheral circuitry, it can be difficult to achieve high speed performance. If the main (non-redundant) area is placed on the right of the array, the memory can still afford high speed performance by use of interleaved pointers. The redundancy area need not use an interleaved scheme, but because it is located at the left side, high speed performance can still be achieved with non-interleave scheme.

A number of other variations are possible, some of which are mentioned above. For example, the array and column circuitry can be split into more than two sets with a corresponding number of interleaved pointers. And although the embodiment of FIGS. 13 and 14 was described as distinct from that of the interleaved pointer arrangement, these are to a large degree complementary and could be combined in a number of ways e.g., each half of FIG. 18 could use the arrangement of FIG. 13).

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

It is claimed:

1. A non-volatile memory circuit, comprising:
    an array of re-programmable non-volatile memory cells formed along columns along bit-lines;
    a plurality of column access circuits each having a corresponding set of one or more temporary data storage devices and each connectable to one or more bit-lines to transfer data between addressed memory cells formed thereupon and the corresponding set of temporary data storage devices;
    a plurality of N intermediate data buses, wherein the column access circuits are arranged into N subsets, each subset connected to a corresponding one of the intermediate data buses;
    a plurality of N shift registers, each including a plurality of series connected stages coupled with a corresponding one of the subsets of the column access circuits in order to enable connection of the temporary data storage devices of the corresponding subset with the corresponding intermediate data bus in successive instances of time as a change of state is propagated from stage-to-stage therealong;
    a first clock source and a plurality of N second clock sources having a frequency of 1/N of the first clock source, each of the N second clock sources connected with a corresponding one of the shift registers to cause the change of state to be propagated along the stages thereof in sequence;
    a unified data bus; and
    a bus combining circuit connected to the intermediate data buses and the unified data bus to transfer data between the intermediate data buses and the unified data bus, where the unified data bus is clocked by the first clock source and carries the combined data content of the intermediate data buses.

2. The non-volatile memory circuit of claim 1 further comprising:
    a clock divider circuit connected to receive the first clock source and generate therefrom the plurality second clock sources.

3. The non-volatile memory circuit of claim 2, wherein the memory circuit is part of a memory system including the memory circuit and a controller, wherein the first clock source is provided from the controller to the memory circuit.

4. The non-volatile memory circuit of claim 1, wherein the first clock source and the second clock sources are provided from external to the memory circuit.

5. The non-volatile memory circuit of claim 1, wherein N is two.

6. The non-volatile memory circuit of claim 5, wherein the two second clock signals have a phase difference of 180 degrees.

7. The non-volatile memory circuit of claim 1, each of the column access circuits is connected to multiple bit-lines.

8. The non-volatile memory circuit of claim 1, wherein the unified data is an input-output bus for the memory circuit.

9. The non-volatile memory circuit of claim 1, wherein intermediate data buses are internal input buses for the memory circuit and the bus combining circuit distributes the combined data content on the unified data bus between the intermediate data buses.

10. The non-volatile memory circuit of claim 1, wherein the intermediate data buses are internal output buses for the memory circuit and the bus combining circuit combines the data output from the intermediate data buses and outputs the combined data content on the unified data bus.

11. The non-volatile memory circuit of claim 1, wherein each of the column access circuits has a plurality of temporary data storage devices, wherein one of the temporary data storage devices from each of the column access circuits is enabled for connection to the corresponding intermediate data bus in response to the change of state.

12. The non-volatile memory circuit of claim 11, wherein a different one of the temporary data storage devices from each of the column access circuits is enabled for connection to the corresponding intermediate data bus in response to the change of state for a subsequent propagation of the change of state from stage-to-stage.

13. A non-volatile memory circuit, comprising:
    an array re-programmable non-volatile memory cells formed along columns along bit-lines;
    a plurality of column access circuits each having a corresponding set of one or more temporary data storage devices and each connectable to one or more bit lines to transfer data between addressed memory cells formed thereupon and the corresponding set of temporary data storage devices;
    a data bus;
    a shift register including a plurality of series connected stages coupled with a corresponding one of the column access circuits in order to enable connection of the temporary data storage devices therein with the data bus in successive instances of time as a change of state is propagated from stage-to-stage therealong, wherein the column access circuits are divided into distinct first and second sets and wherein, in an access operation, the change of state propagates in a sequence moving in a first direction along the first set and subsequently in a sequence moving in a direction opposite the first direction in the second set; and
    a clock source connected to the shift register to cause the change of state to be propagated along the stages thereof in said sequence.

14. The non-volatile memory circuit of claim 13, wherein each of the column access circuits is connectable to a plurality of bit lines.

15. The non-volatile memory circuit of claim 13, wherein the first set and the second set of the column access circuits have the same number of elements.

16. The non-volatile memory circuit of claim 15, wherein the first set of the column access circuits is every other column access circuit as physically arranged on the memory circuit.

17. The non-volatile memory circuit of claim 13, wherein each of the column access circuits has a plurality of temporary data storage devices, wherein one of the temporary data storage devices from each of the column access circuits is enabled for connection to the corresponding intermediate data bus in response to the change of state.

18. The non-volatile memory circuit of claim 17, wherein a different one of the temporary data storage devices from each of the column access circuits is enabled for connection to the corresponding intermediate data bus in response to the change of state for a subsequent propagation of the change of state from stage-to-stage.

* * * * *